United States Patent
Shimotsusa

(10) Patent No.: US 6,800,902 B2
(45) Date of Patent: Oct. 5, 2004

(54) SEMICONDUCTOR DEVICE, METHOD OF MANUFACTURING THE SAME AND LIQUID JET APPARATUS

(75) Inventor: Mineo Shimotsusa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/067,904

(22) Filed: Feb. 8, 2002

(65) Prior Publication Data

US 2002/0125511 A1 Sep. 12, 2002

(30) Foreign Application Priority Data

Feb. 16, 2001 (JP) ........................................ 2001-040430
Feb. 16, 2001 (JP) ........................................ 2001-040431

(51) Int. Cl.$^7$ .................... G01D 15/00; H01L 26/76; H01L 29/94; H01L 27/01; H01L 27/12; H01L 31/062; H01L 31/113; H01L 31/119; H01L 31/0392

(52) U.S. Cl. ................... 257/341; 257/335; 257/351; 257/368; 257/288; 438/197; 216/27

(58) Field of Search ................... 257/335, 351, 257/288, 368, 341; 438/197; 216/13, 27, 62

(56) References Cited

U.S. PATENT DOCUMENTS

| | | | |
|---|---|---|---|
| 5,517,224 A | 5/1996 | Kaizu et al. | 347/59 |
| 5,602,576 A | 2/1997 | Murooka et al. | 347/59 |
| 5,666,142 A | 9/1997 | Fujita et al. | 347/59 |
| 5,767,551 A | 6/1998 | Smayling et al. | 257/370 |
| 5,850,242 A | 12/1998 | Asaba | 347/59 |
| 5,911,104 A | 6/1999 | Smayling et al. | 438/202 |
| 6,290,334 B1 | 9/2001 | Ishinaga et al. | 347/59 |
| 6,302,504 B1 | 10/2001 | Imanaka et al. | 347/9 |
| 2001/0023965 A1 * | 9/2001 | Ikeda et al. | 257/368 |

FOREIGN PATENT DOCUMENTS

| | | | | |
|---|---|---|---|---|
| JP | 11-31816 | | 2/1999 | |
| JP | 11-031816 | * | 2/1999 | 29/78 |
| JP | 11-138775 | | 5/1999 | |

* cited by examiner

Primary Examiner—Nathan J. Flynn
Assistant Examiner—Victor A. Mandala, Jr.
(74) Attorney, Agent, or Firm—Fitzpatrick, Cella, Harper & Scinto

(57) ABSTRACT

In a semiconductor device in which a switching element for allowing a current to flow to a load and a circuit for driving the switching element are formed on a common substrate, the switching element is formed of a DMOS transistor, and the circuit for driving the switching element includes an MOS transistor having a characteristic different from that of the DMOS transistor.

32 Claims, 20 Drawing Sheets

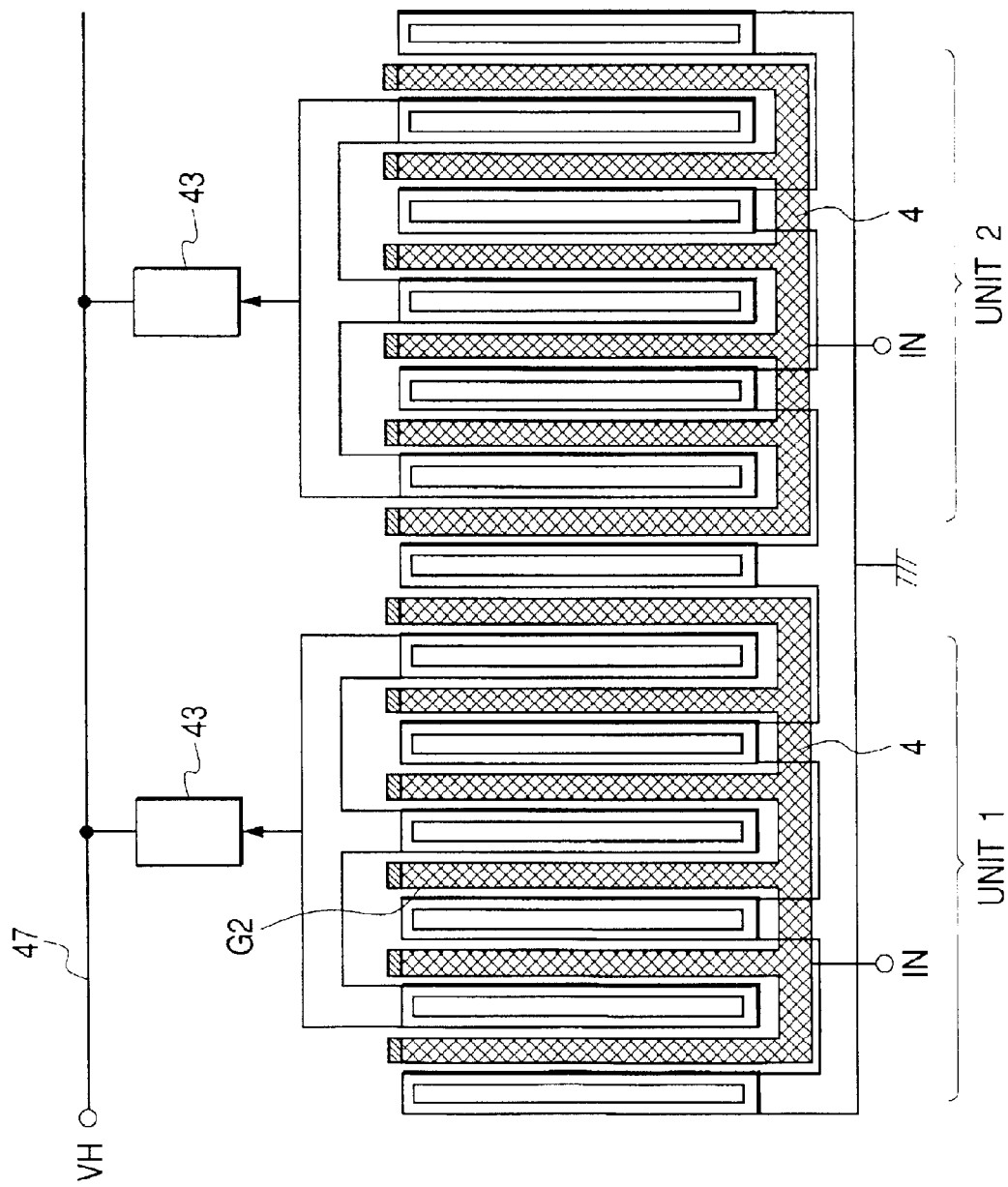

SEMICONDUCTOR DEVICE, METHOD OF MANUFACTURING THE SAME AND LIQUID JET APPARATUS

BACKGROUND OF THE INVENTION

1. Field of the Invention

The present invention relates to a semiconductor device including transistors that are called an insulated gate transistor, a MIS (metal insulator semiconductor) field effect transistor or an MOS transistor, and more particularly to a semiconductor device that can be suitably mounted on an ink jet printer used as an output terminal such as a copying machine, a facsimile machine, a word processor or a computer, or on a liquid jet apparatus for manufacturing a DNA chip or an organic TFT, a method of manufacturing the same, and a liquid jet apparatus.

2. Related Background Art

Now, an example of a semiconductor device used in the liquid jet apparatus will be described.

In a recording apparatus used as various output terminals, an electro-thermal converter, an element that switches the electro-thermal converter element (hereinafter referred to as "switching element"), and a circuit for driving the switching element are mounted on a common substrate as a recording head.

FIG. 19 is a schematic cross-sectional view showing a part of a recording head according to a conventional structure.

Reference numeral 901 denotes a semiconductor substrate made of single crystal silicon. Reference numeral 912 is a p-type well region, 908 is an n-type drain region having a high impurity concentration, 916 is an n-type field relaxation drain region having a low impurity concentration, 907 is an n-type source region having a high impurity concentration, and 914 is a gate electrode. These elements form a switching element 930 using a MIS field effect transistor. Reference numeral 917 denotes a regenerative layer and a silicon oxide layer that functions as an insulating layer, 918 is a tantalum nitride film that functions as a heat resistant layer, 919 is an aluminum alloy film that functions as a wiring, and 920 is a silicon nitride film that functions as a protective layer. These elements form a substrate 940 of the recording head. In this example, reference numeral 950 denotes a heating portion, and an ink is jetted from 960. Also, a roof 970 defines a liquid passage 980 in cooperation with the substrate 940.

Incidentally, improvements have been frequently made to the recording head and the switching element structured as described above. In recent years, demands have been further made to increase a drive speed, to save an energy, to increase integration, to reduce the costs and to enhance the performance, with respect to such products.

A plurality of MIS field effect transistors 930 used as the switching elements shown in FIG. 19 are produced within the semiconductor substrate 901. And these MIS field effect transistors 930 are operated independently or at the same time to drive the connected electro-thermal converter.

However, when the conventional MIS field effect transistor 930 functions under the condition where a large current required to drive a load such as the electro-thermal converter flows, a pn reverse bias junction portion between a drain and a well generates a leak current since it cannot withstand a high electric field, and therefore it cannot satisfy a breakdown voltage required as a switching element. In addition, when the on resistance of the MIS field effect transistor used as the switching element is large, there arises such a problem to be solved that a current necessary to drive the electro-thermal converter cannot be obtained by resulting wasteful current consumption.

SUMMARY OF THE INVENTION

The present invention has been made in view of the above circumstances, and therefore an object of the present invention is to provide a high-performance semiconductor device including an insulated gate transistor, which allows a large current to flow, and enables high-speed drive at a high breakdown voltage, energy saving and high integration.

Another object of the present invention is to provide a liquid jet apparatus which allows a large current to flow, and enables high-speed drive at a high breakdown voltage, energy saving and high integration.

Still another object of the present invention is to provide a method of manufacturing a high-performance semiconductor device which can achieve higher integration and reduced costs.

According to an aspect of the present invention, there is provided a semiconductor device in which a switching element for allowing a current to flow in a load and a circuit for driving the switching element are formed on a common substrate, characterized in that:

the switching element is a first insulated gate transistor which comprises:
   a first semiconductor region of a second conductive type disposed at one main surface of a semiconductor substrate of a first conductive type;
   a second semiconductor region of the first conductive type disposed within the first semiconductor region;
   a first gate electrode disposed on a surface at which a pn junction between the second semiconductor region and the first semiconductor region terminates through an insulating film;
   a first source region of the second conductive type disposed on one end portion side of the first gate electrode within the second semiconductor region; and
   a first drain region of the second conductive type disposed within the first semiconductor region; and that the circuit for driving the switching element comprises a second insulated gate transistor having a characteristic different from the first insulated gate transistor.

Here, the second insulated gate transistor preferably constitutes a level shift circuit that generates a drive voltage applied to the first gate electrode.

The drain region of the second insulated gate transistor preferably includes a low impurity concentration region.

It is preferable that the second insulated gate transistor constitute a level shift circuit that generates a drive voltage applied to the first gate, and that a low impurity concentration region be disposed within a drain region of the second insulated gate transistor.

The second insulated gate transistor preferably comprises a source follower transistor that constitutes a level shift circuit that generates a drive voltage applied to the first gate through a CMOS circuit.

A well potential of the second insulated gate transistor is preferably different from both a source potential and a drain potential.

A drain region of the second insulated gate transistor preferably has a low impurity concentration region that is formed to be shallower than the first semiconductor region.

A drain region of the second insulated gate transistor preferably has a low impurity concentration region having the same depth as that of the first semiconductor region.

The second semiconductor region is preferably formed to be deeper than the first semiconductor region.

A plurality of first insulated gate transistors are preferably arranged in an array, without dedicated element isolation regions being interposed therebetween.

The second insulated gate transistor is preferably an MOS transistor of the first conductive type which constitutes a low-voltage CMOS circuit.

It is preferable that the circuit for driving the switching element comprises a low-voltage CMOS circuit having the second insulated gate transistor, and a high-voltage CMOS circuit that is controlled by the low-voltage CMOS circuit, and that an MOS transistor of the first conductive type which constitutes the high-voltage CMOS circuit is a DMOS transistor produced in the same process as that for forming the first insulated gate transistor.

It is preferable that the semiconductor device of the present invention further comprise a level shift circuit that generates a drive voltage applied to the first gate electrode through the high-voltage CMOS circuit.

The second insulated gate transistor preferably includes source and drain regions of the first conductive type which are formed within the well of the second conductive type.

An electro-thermal converter that functions as the load is preferably connected to a drain of the switching element and is integrated.

The characteristic described above preferably refers to at least one selected from a threshold value, a breakdown voltage and a substrate current.

According to another aspect of the present invention, there is provided a semiconductor device in which a switching element for allowing a current to flow to a load and a circuit for driving the switching element are formed on a common substrate, characterized in that:

the switching element is formed of a DMOS transistor; and the circuit for driving the switching element includes an MOS transistor having a characteristic different from that of the DMOS transistor.

Here, the MOS transistor is preferably of the same conductive type as that of the DMOS transistor.

A drain region of the MOS transistor preferably has a low impurity concentration region.

It is preferable that the MOS transistor constitute a level shift circuit that generates a drive voltage applied to a gate electrode of the DMOS transistor, and a low impurity concentration region be disposed within the drain region.

The MOS transistor is preferably a source follower transistor that constitutes a level shift circuit that generates a drive voltage applied to the gate electrode of the DMOS transistor through a CMOS circuit.

A well potential of the MOS transistor is preferably different from both a source potential and a drain potential.

A drain region of the MOS transistor preferably has a low impurity concentration region that is formed shallower than a base region that becomes a channel of the DMOS transistor.

A drain region of the MOS transistor preferably has a low impurity concentration region having the same depth as that of a base region that becomes a channel of the DMOS transistor.

A base region that becomes a channel of the DMOS transistor is preferably formed to be deeper than a lightly doped drain region.

A plurality of the DMOS transistors are preferably arranged in an array without dedicated element separation regions being interposed therebetween.

The MOS transistor preferably is an MOS transistor of the first conductive type which constitutes a low-voltage CMOS circuit.

It is preferable that the circuit for driving the switching element preferably comprises a low-voltage CMOS circuit having the MOS transistor and a high-voltage CMOS circuit that is controlled by the low-voltage CMOS circuit, and an MOS transistor of the first conductive type which constitutes the high-voltage CMOS circuit is a DMOS transistor produced in the same process as that for forming the DMOS transistor.

It is preferable that the semiconductor device of the present invention further comprise a level shift circuit that generates a drive voltage applied to the gate electrode of the DMOS transistor that functions as the switching element, through the high-voltage CMOS circuit.

The DMOS transistor preferably includes first conductive type source and drain regions formed within the second conductive type well.

An electro-thermal converter that functions as the load is preferably connected to a drain of the DMOS transistor for integration.

The DMOS transistor preferably comprises:
  a first semiconductor region of a second conductive type disposed at one main surface of a semiconductor substrate of a first conductive type;
  a second semiconductor region of the first conductive type disposed within the first semiconductor region;
  a first gate electrode disposed on a surface in which a pn junction between the second semiconductor region and the first semiconductor region terminates, through an insulating film;
  a first source region of the second conductive type which is disposed on one end portion side of the first gate electrode within the second semiconductor region; and
  a first drain region of the second conductive type which is disposed within the first semiconductor region.

The second insulated gate transistor or an MOS transistor preferably has an on resistance that is equal or greater, and an operation breakdown voltage that is $2/3$ or lower, as compared with those of the first insulated gate transistor or a DMOS transistor.

The second insulated gate transistor or an MOS transistor preferably has an on resistance that is equal or greater, and the maximum substrate current within an operation range which is 10 times or higher, as compared with those of the first insulated gate transistor or a DMOS transistor.

According to another aspect of the present invention, there is provided a liquid jet apparatus that jets a liquid by using a heat generated by an electro-thermal converter, characterized by comprising:
  the above-mentioned semiconductor device;
  a discharge opening disposed in correspondence with the electro-thermal converter that becomes a load;
  a container that contains the liquid that is supplied onto the electro-thermal converter; and
  a power circuit for supplying a power voltage to the semiconductor device.

According to still another aspect of the present invention, there is provided a method of manufacturing a semiconductor device in which a switching element and a circuit for driving the switching element are formed on a common substrate, characterized by comprising the steps of:

forming a first semiconductor region of a second conductive type on a surface of a first conductive type semiconductor substrate;

forming a gate insulating film on the first semiconductor region;

forming a first gate electrode on the surface of the first semiconductor region through the gate insulating film, and a second gate electrode on the surface of the semiconductor substrate through the gate insulating film;

forming a second semiconductor region of a first conductive type which is higher in concentration than the first semiconductor region, within the first semiconductor region by ion implantation of first conductive type impurities with the first gate electrode as a mask;

forming a lightly doped drain region of the second conductive type in the semiconductor substrate by ion implantation of second conductive type impurities with aid second gate electrode as a mask; and forming a first source region of the second conductive type on a surface side of the second semiconductor region by ion implantation with the first gate electrode as a mask, forming a first source region of the second conductive type on a surface side of the first semiconductor region, forming a second source region of the second conductive type on a surface side of the semiconductor substrate by ion implantation, and forming a second drain region of the second conductive type so as to be apart from an end portion of the lightly doped drain region on the second gate electrode side.

In this example, the second semiconductor region may be formed so as to be higher in concentration than the first semiconductor region and deeper than the first semiconductor region, in order to electrically isolate the first semiconductor region by ion implantation of the first conductive impurities with the first gate electrode as a mask and by a heat treatment.

According to yet still another aspect of the present invention, there is provided a method of manufacturing a semiconductor device in which a switching element and a circuit for driving the switching element are formed on a common substrate, characterized by comprising the steps of:

forming a plurality of first semiconductor regions of a second conductive type on a surface of a semiconductor substrate of a first conductive type;

forming a gate insulating film on the plurality of first semiconductor regions;

forming a first gate electrode on a surface of one of the plurality of first semiconductor regions through the gate insulating film, and a second gate electrode on a surface in which a pn junction between the semiconductor substrate and another one of the plurality of first semiconductor regions terminates, through the gate insulating film;

forming a second semiconductor region of the first conductive type within one of the plurality of first semiconductor regions by ion implantation of first conductive type impurities, with the first gate electrode as a mask;

forming a first source region of the second conductive type by ion implantation of second conductive type impurities on the surface side of the second semiconductor region with the first gate electrode as a mask, forming a first drain region of the second conductive type on a surface side of the first semiconductor region, forming a second source region of the second conductive type on a surface side of the semiconductor substrate, and forming a second drain region of the second conductive type on the surface side of the first semiconductor region so as to be apart from a pn junction between the semiconductor substrate and the first semiconductor region.

In this example, the second semiconductor region may be formed so as to be higher in concentration than the first semiconductor region and deeper than the first semiconductor region, in order to isolate one of the plurality of first semiconductor regions.

BRIEF DESCRIPTION OF THE DRAWINGS

FIG. 13 is a top view showing a switching element of a semiconductor device in accordance with a fifth embodiment of the present invention;

DETAILED DESCRIPTION OF THE PREFERRED EMBODIMENTS

Now, a description will be given in more detail of preferred embodiments of the present invention.

Figure 1A:
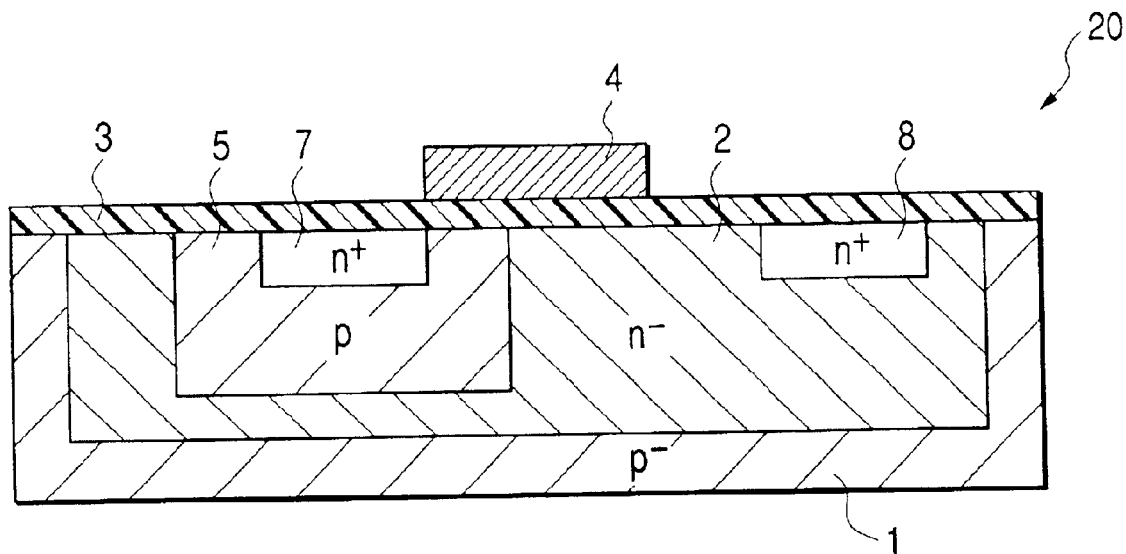
FIG. 1A is a cross-sectional view showing a switching element used in the present invention.
Figure 1B:
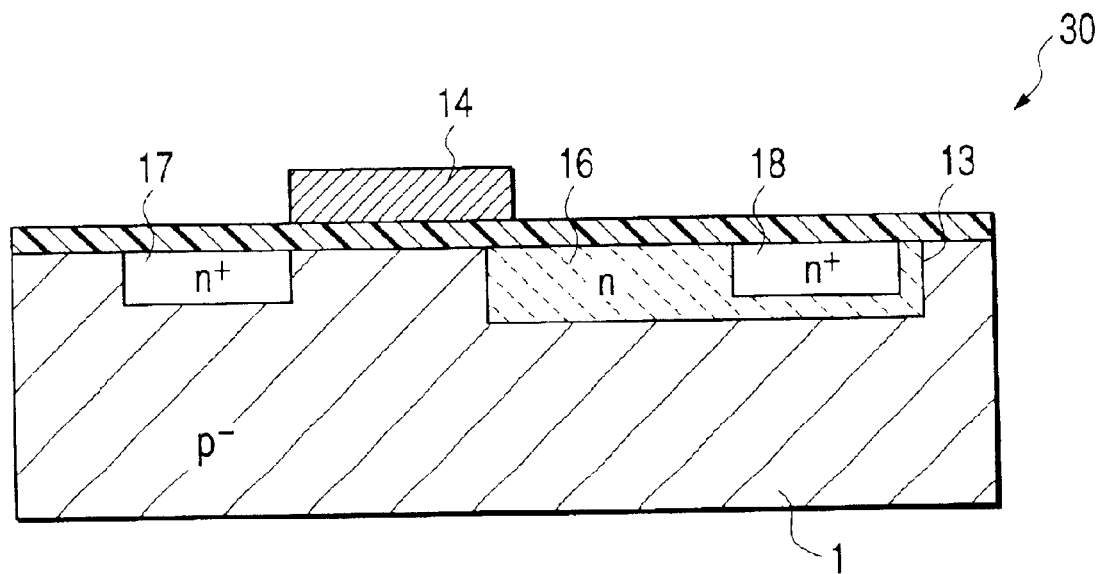
FIG. 1B is a circuit-sectional view showing a drive circuit element used in the present invention.

FIGS. 1A and 1B show cross-sectional structures of a switching element and an element that constitutes a circuit for driving the switching element, respectively.

Reference numeral 1 denotes a semiconductor substrate of a first conductive type (in this example, p-type), 2 is a well region that is a first semiconductor region of a second conductive type (in this example, n-type), 3 is a gate insulating film, 4 is a gate electrode, 5 is a base region which is a second semiconductor region of the first conductive type, 7 is a source region, and 8 is a high-concentration drain region. These regions form a DMOS (double diffused metal oxide semiconductor) transistor 20.

The DMOS transistor 20 that functions as the switching element shown in FIG. 1A forms a base region 5 within a well region 2 that has been formed sufficiently deeply in advance. The well region 2 and the base region 5 function as a drain and a channel in the insulated gate transistor, respectively. For that reason, conversely to a conventionally adopted order of introducing impurities into a region that becomes a channel to thereby form a drain, the impurities are introduced into a region that becomes the drain to thereby form a base region that becomes the channel, and therefore it is possible to set the concentration of the drain to be lower than the concentration of the channel. A pn junction between the base region 5 and the wall region 2 terminates on the surface of a semiconductor body on which the gate insulating film 3 is formed.

The breakdown voltage of the transistor is determined in accordance with the breakdown voltage of the drain, and the breakdown voltage of the transistor becomes higher as the concentration of the drain becomes lower and as the depth of the drain becomes deeper. For that reason, a rated voltage can be set to be high, a large current can be allowed to flow, and high-speed operation can be realized.

Also, the effective channel length of the DMOS transistor 20 is determined by a difference in the amount of lateral diffusion between the base region 5 and the source region 7. Because the amount of lateral diffusion is determined on the basis of a physical coefficient, the effective channel length can be set to be relatively short and the on resistance value can be lowered. Such reduction in on current value enables a larger amount of current to flow per unit dimension, which in turn enables high-speed operation, energy saving as well as higher integration.

Also, the base region 5 and the source region 7 can be both formed in a self alignment manner by introduction of ions with the gate electrode 4 as a mask. For that reason, the MIS field effect transistor can be manufactured without a dimensional difference caused during alignment, and the variation in the threshold value is thus suppressed.

In addition, as occasion demands, if the depth of the base region 5 is set deeper than a bottom of the well region 2 so as to be continuous to the semiconductor substrate, a plurality of DMOS transistors can be arranged in an array without any provision of a dedicated element isolation region between the base region 5 and the well region. As a result, an area occupied by the DMOS transistor array can be reduced. Also, freedom of design regarding the layout of a wiring that is connected to a load is improved.

FIG. 1B shows an MOS transistor 30 that functions as an element contained in a circuit for driving the switching element shown in FIG. 1A.

In this example, reference numeral 1 denotes a semiconductor substrate of a first conductive type, 13 is a gate insulated film, 14 is a gate electrode, 16 is a lightly doped drain region provided as occasion demands, 17 is a source region, and 18 is a highly doped drain region formed laterally apart from the gate electrode.

As in the MOS transistor 30, if there is applied a structure in which there is provided a field relaxation drain region (lightly doped drain region) 16, and the highly doped drain region 18 is formed apart from the end portion of the pn junction between the channel and the lightly doped drain and is also apart from the gate electrode, a breakdown voltage between the source and the drain can be set to be higher than that of the normal MOS transistor in which the source and drain regions are formed in a self-alignment manner with respect to the gate electrode.

Also, since the MOS transistor 30 is not the DMOS, the channel length can be freely designed, with the result that an arbitrary threshold voltage can be set.

Further, although the transistors shown in FIGS. 1A and 1B are transistors having mutually different characteristics in terms of a threshold value, a breakdown voltage or a substrate current, they can be integrated with each other by using a common substrate such as a silicon substrate as the substrate 1. As a result, a large current can be allowed to flow in the load. Also, the breakdown voltage of the switching element can be increased so as to suppress the substrate current. In addition, a circuit that drives the switching element can be freely designed.

Figure 2:
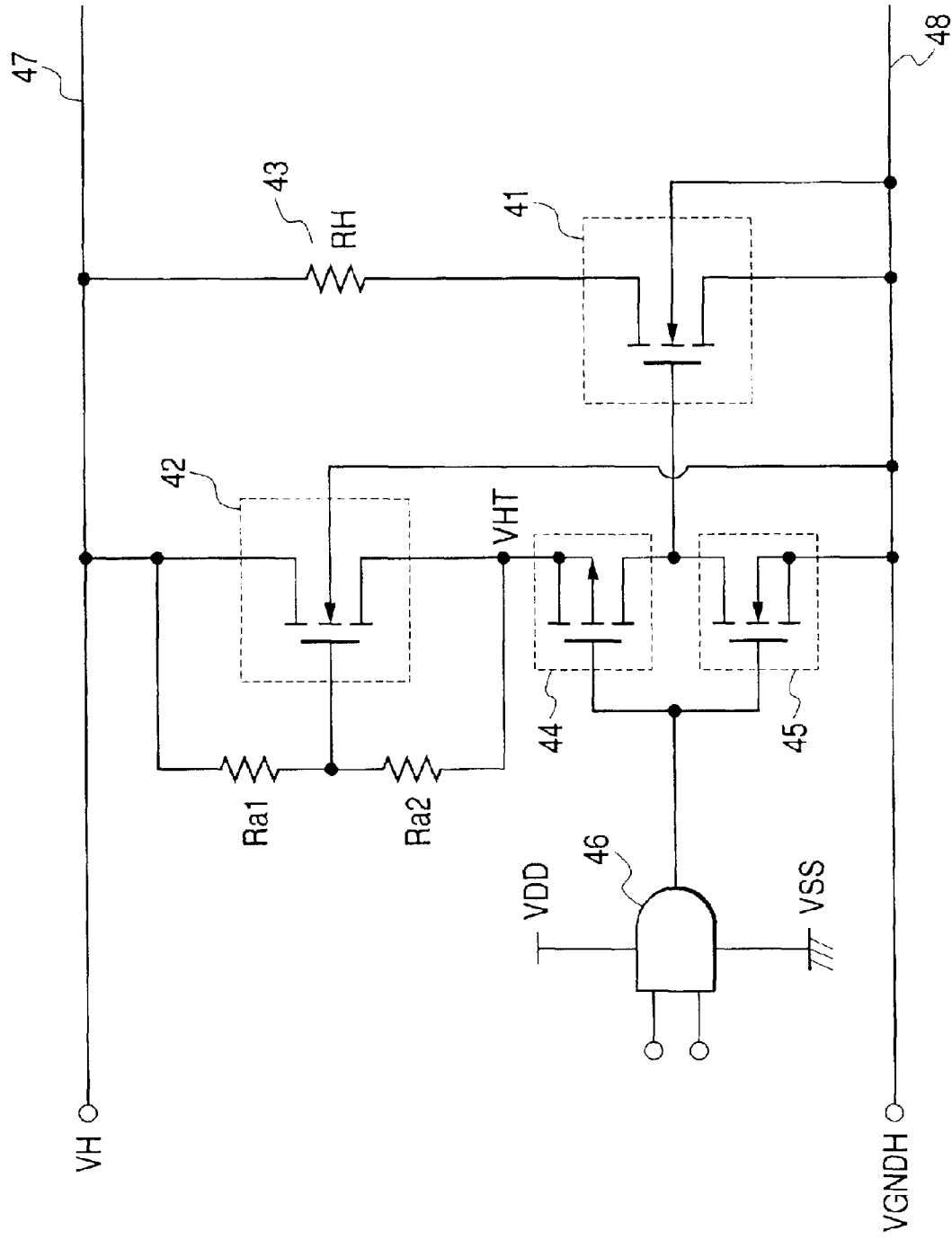
FIG. 2 is a circuit diagram of a semiconductor device in accordance with one embodiment of the present invention.

If two kinds of transistors such as shown in FIGS. 1A and 1B are used, for example, the circuit structure shown in FIG. 2 can be realized.

In FIG. 2, reference numeral 43 is a load such as an electro-thermal converter, and a switching element 41 made up of the transistor 20 shown in FIG. 1A is connected between the load 43 and a low-potential side wiring 48 to which a low reference voltage VGNDH is applied.

In this example, a circuit structure having a level shift circuit, a CMOS circuit and a logic circuit is adopted as an example of a circuit that drives the switching element 41.

The gate of the switching element 41 is connected with a high-voltage CMOS circuit having a pMOS transistor 44 and an nMOS transistor 45, and an input terminal of the CMOS circuit is connected with an AND gate 46. The high-potential side of the CMOS circuit is connected with a level shift circuit that gives an intermediate reference voltage VHT.

As the level shift circuit, a source follower circuit element 42 made up of the MOS transistor 30, such as shown in FIG. 1B, is preferably used. The level shift circuit generates a reference voltage VHT which is lower by about several volts to ten and several volts than a high reference voltage VH that is supplied from the high-potential side wiring 47.

The reference voltage VHT can be applied to the gate of the switching element 41 through the pMOS transistor 44 of the CMOS circuit.

The high-voltage CMOS circuit is controlled by a logic circuit such as the AND gate 46. The logic circuit of this type can be also structured by a CMOS circuit. Since the drive voltage VDD of the AND gate 46 is further lower than the reference voltage VHT, the logic circuit can be structured by the low-voltage CMOS circuit.

In the case where the reference voltage VHT is not so high, the transistor that constitutes the high-voltage CMOS circuit can be structured by a normal MOS transistor in which, unlike those shown in FIGS. 1A and 1B, no lightly doped drain region (field effect relaxation drain region) is provided.

Preferably, an offset MOS transistor shown in FIG. 1B may be used as at least the nMOS transistor 45 within the high-voltage CMOS circuit. More preferably, the DMOS transistor shown in FIG. 1A may be used as the nMOS transistor 45.

The logic circuit such as the AND gate 46 can be structured not by the DMOS transistor shown in FIG. 1A but by the transistor shown in FIG. 1B or a general MOS transistor having, unlike the above two transistors, no lightly doped drain region.

As described above, a DMOS transistor is used as the switching element and a non-DMOS transistor having a characteristic (regarding at least one selected from a threshold value, a breakdown voltage, a substrate current and so on) that is different from that of the DMOS transistor is used in at least a part of the circuit for driving the switching element, thereby making it possible to provide a high-performance semiconductor device including an insulated gate transistor, which allows a large current to flow therein and enables a high-speed drive at a high breakdown voltage, an energy saving and a high integration.

Also, if the low-concentration drain region 16 is set to be equal in depth to the well region 2, it is possible to form the lightly doped drain region 16 and the well region 2 in the same single process.

In addition, in the case where the reference voltage VHT is not so high, as the pMOS transistor that constitutes the high-voltage CMOS circuit, there may be used a pMOS transistor obtained by forming an n-type well region having thus same conductive type as that of the well region 2 within the semiconductor substrate 1 and then forming p-type source and drain regions in the above n-type well region, which can be structured by the general MOS transistor having no lightly doped drain region.

In this example, a drive circuit for a high-breakdown voltage liquid jet apparatus using a DMOS as the switching element will be exemplified and described.

Figure 20:
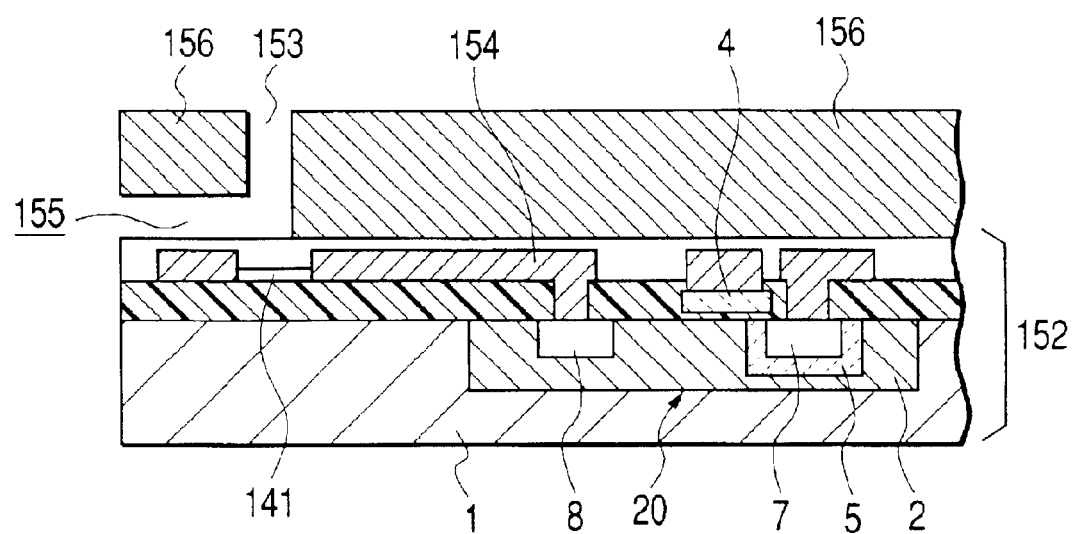
FIG. 20 is a schematic cross-sectional view showing the recording head.

In order to solve a problem regarding the breakdown voltage of the switching element, a DMOS transistor 20 shown in FIG. 20 may be conceived.

Referring to FIG. 20, reference numeral 152 denotes an element substrate on which an electro-thermal converter 141 that functions as a load, a DMOS transistor 20 and an MOS transistor (not shown) are integrated, 153 is a discharge opening, 154 is a wiring electrode, 155 is a liquid passage, and 156 is a member called a ceiling or the like.

The structure of the DMOS transistor 20 is different from the structure of the normal MOS transistor as described above, such that a channel is produced in the drain to thereby form a depth of the drain that determines the breakdown voltage to be larger and to provide the drain at low impurity concentration, with the result that the problem regarding the breakdown voltage can be solved.

However, although the DMOS transistor 20 has high performance regarding its characteristics as the switching element as described above, it is rather inconvenient as an analog element. The insulated gate transistor is so designed as to obtain an arbitrary threshold voltage by adjusting the gate length, that is, the channel length of the analog element with a photolithographic mask. Also, the analog element must withstand the circuit structure in which a back gate voltage is applied to a substrate.

The channel length of the DMOS transistor 20 is determined by a difference in the amount of lateral diffusion between a base layer and a source layer. For that reason, the channel length is shorter than that of the normal insulated gate transistor and cannot be adjusted with a mask.

Also, in the case where the reference voltage VHT is high, if the DMOS transistor 20 is used as the switching element, and a normal MIS transistor is used in a level shift circuit, the breakdown voltage of the level shift element that drives the switching element becomes insufficient.

Figure 21:
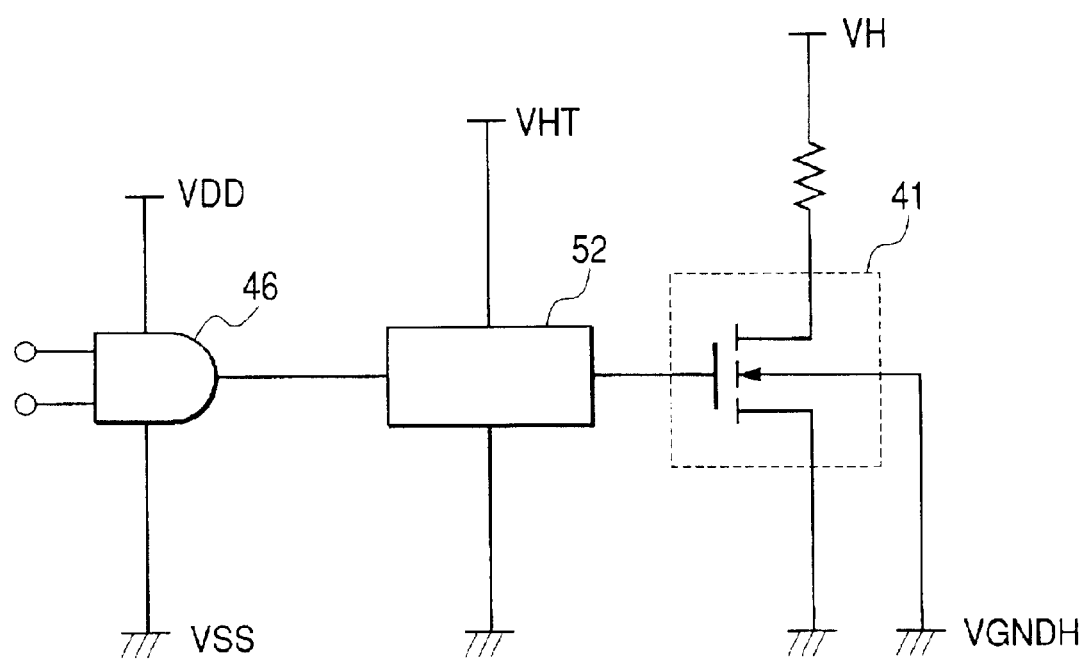
FIG. 21 is a circuit diagram of a circuit that causes a current to flow to a load.

More specifically, in the case of the circuit structure shown in FIG. 21, if VDD is set to 5.0 V to 3.3 V, VDD passes through the CMOS circuit 52 such as a source grounded CMOS inverter from the AND gate 46 as a high-level signal and is then inputted to the gate of the switching element 41.

Of particular importance here is the arbitrary voltage VHT that is applied to the CMOS circuit 52. The VHT is designed such that the on resistance of the switching element 41 becomes minimum. This is because if the on resistance of the switching element 41 becomes minimum, the dimensions of the MOS transistor that constitutes the switching element can be minimized.

When the VHT is to be produced within the integrated circuit, it is necessary to change the voltage level from the supply voltage VH within the integrated circuit.

For that reason, it is desirable that a source follower transistor be interposed in the level shift circuit to obtain a constant voltage.

In the case where such a level shift circuit is incorporated in FIG. 21, the above-mentioned circuit structure shown in FIG. 2 is obtained.

In this case, when an intermediate reference voltage VHT is set to 12 V assuming that, for example, the highest supply voltage VH is 30 V, and the lowest reference voltage VGNDH is 0 V, a back gate voltage of −12 V is applied to the source follower transistor used in the level shift circuit, and a required breakdown voltage between the drain and the source becomes 18 V or more.

As described above, when the DMOS transistor having excellent switching characteristic is adopted as the switching element, there is required an intermediate breakdown voltage element having an analog characteristic that can set an arbitrary threshold voltage and can withstand even the back gate voltage that is higher than the supply voltage of the logic circuit.

In such a case, an offset MOS transistor of a non-DMOS type having a lightly doped drain region is preferably used as a transistor that constitutes the level shift circuit.

Also, in the case where the reference voltage VHT is high, it is desirable that a breakdown voltage between the channel and the drain in the nMOS transistor 45 of the high-breakdown voltage CMOS circuit is also set to be higher. To achieve this, the offset nMOS transistor such as shown in FIG. 1B, more preferably the DMOS transistor that is the same as that in FIG. 1B may be preferably used as the nMOS transistor 45.

The liquid jet apparatus thus obtained in accordance with the present invention includes the above-mentioned semiconductor device, the electro-thermal converter that functions as a load connected to the switching element of the above semiconductor device, and a discharge opening for jetting therethrough a liquid such as an ink.

(First Embodiment)

Next, a first embodiment of the present invention will be described with reference to the accompanying drawings. The cross-sectional structures of the switching element and the drive circuit element are identical with those shown in FIGS. 1A and 1B.

Reference numeral 1 denotes a semiconductor substrate of a first conductive type, 2 is a well region which is a first semiconductor region of a second conductive type, 3 is a gate insulating film, 4 is a gate electrode, 5 is a base region which is a second semiconductor region of a first conductive type, 7 is a source region that is aligned with the left end portion of the gate electrode, and 8 is a highly doped drain region which is formed apart from an end portion of a pn junction between the well region and the base region to the right hand side in the drawing, and is also laterally apart from the gate electrode.

The DMOS transistor 20 shown in FIG. 1A forms the base region 5 within the well region 2 that has been formed to be sufficiently deep in advance. The well region 2 and the base region 5 function as the drain and the channel in the MIS field effect transistor, respectively.

Also, the effective channel length of the DMOS transistor 20 is determined by a difference in the amount of lateral diffusion between the base region 5 and the source region 7. Because the amount of lateral diffusion is determined on the basis of a physical coefficient, the effective channel length can be set to be shorter, thereby making it possible to reduce the on resistance.

Also, because both of the base region 5 and the source region 7 are formed in a self-alignment manner by the introduction of ions with the gate electrode 4 as a mask, there occurs no dimensional difference due to the alignment, thereby making it possible to suppress a variation in the threshold value of the DMOS transistor.

FIG. 1B shows an offset MOS transistor 30 contained in a circuit for driving the switching element shown in FIG. 1A, in which reference numeral 1 denotes a semiconductor substrate of a first conductive type, 13 is a gate insulating film, 14 is a gate electrode, 16 is a lightly doped drain region, 17 is a source region that is aligned with the left end portion of the gate electrode, 18 is a highly doped drain region formed laterally apart from the gate electrode.

Since a field relaxation drain region 16 is disposed at the drain region 18 side, and the highly doped drain region 18 is formed so as to be apart from the end portion of a pn junction between the channel and the lightly doped drain and is also apart from the gate electrode, it is possible to set a breakdown voltage between the source and the drain to be high.

Also, because the channel length can be freely set as far as it has the minimum machining dimension or more for the photolithography, an arbitrary threshold voltage can be set, and thus the analog characteristic for withstanding the back gate voltage is imparted to thereby allow freedom of design.

The two kinds of transistors 20 and 30 having mutually different characteristics, which are shown in FIGS. 1A and 1B, can be integrated together by using a common substrate such as a silicon substrate as the substrate 1. As a result, an integrated circuit in which these are integrated with the load as shown in FIG. 2 can be realized.

Referring to FIG. 2, reference numeral 43 denotes a load such as an electro-thermal converter having a resistance value RH, and its low-potential side wiring 48 is connected with a DMOS transistor 20 as the switching element 41. The gate of the switching element 41 is connected with a CMOS inverter, and an input terminal of the CMOS inverter is connected with the AND gate 46. An offset MOS transistor 30 shown in FIG. 1B is used in the level shift circuit that gives a reference voltage VHT at the high potential side of the CMOS inverter. A transistor that constitutes the logic circuit can be made up of a general MOS transistor having, unlike those shown in FIGS. 1A and 1B, no lightly doped drain region.

A pMOS transistor 44 in the high-voltage CMOS circuit can be made up of a general MOS transistor having no lightly doped drain region.

Figure 3:
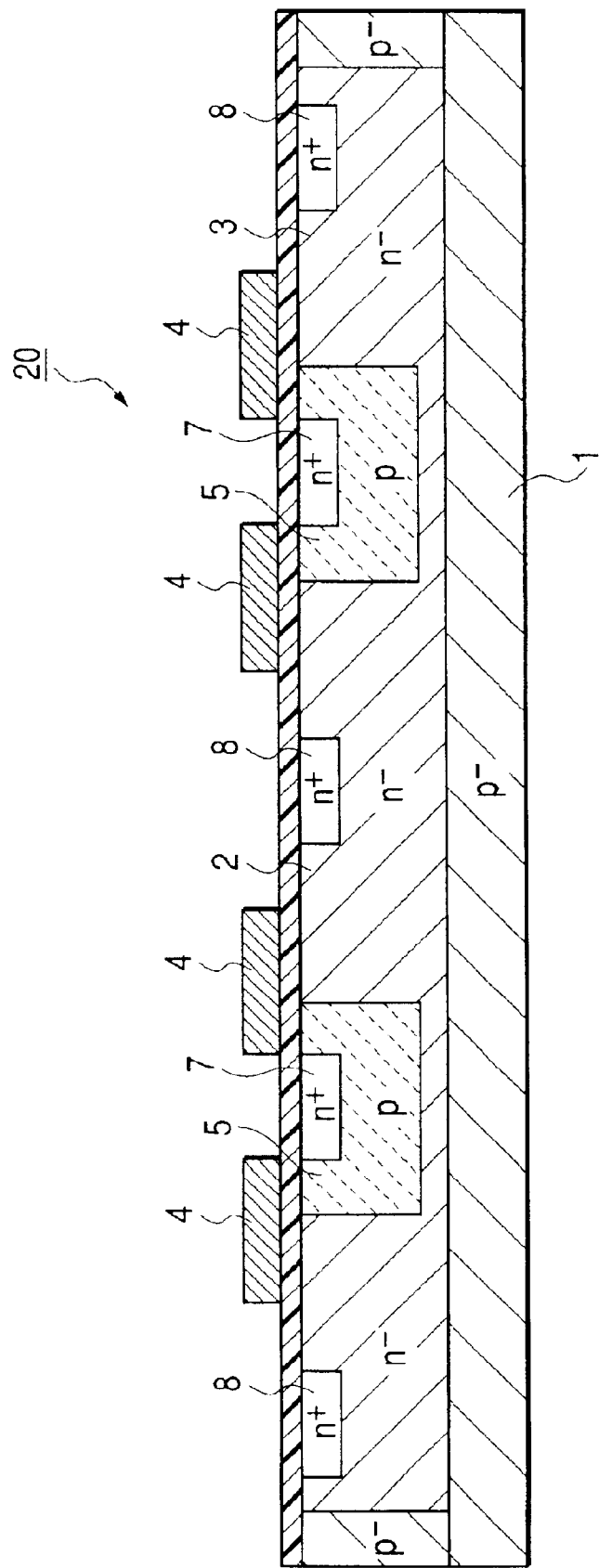
FIG. 3 is a cross-sectional structural view showing one switching element used in the present invention.

FIG. 3 shows a cross-section of a more preferable example of one DMOS transistor used as one switching element 41.

As the switching element 41, preferably as shown in FIG. 3, a DMOS transistor in which sources and drains are alternately arranged on a common substrate may be adopted. This is because the above structure is equivalent to a structure in which a plurality of DMOS transistors are connected in parallel, and a current that is allowed to flow in the load 43 which is a passive element can be increased.

Figure 4:
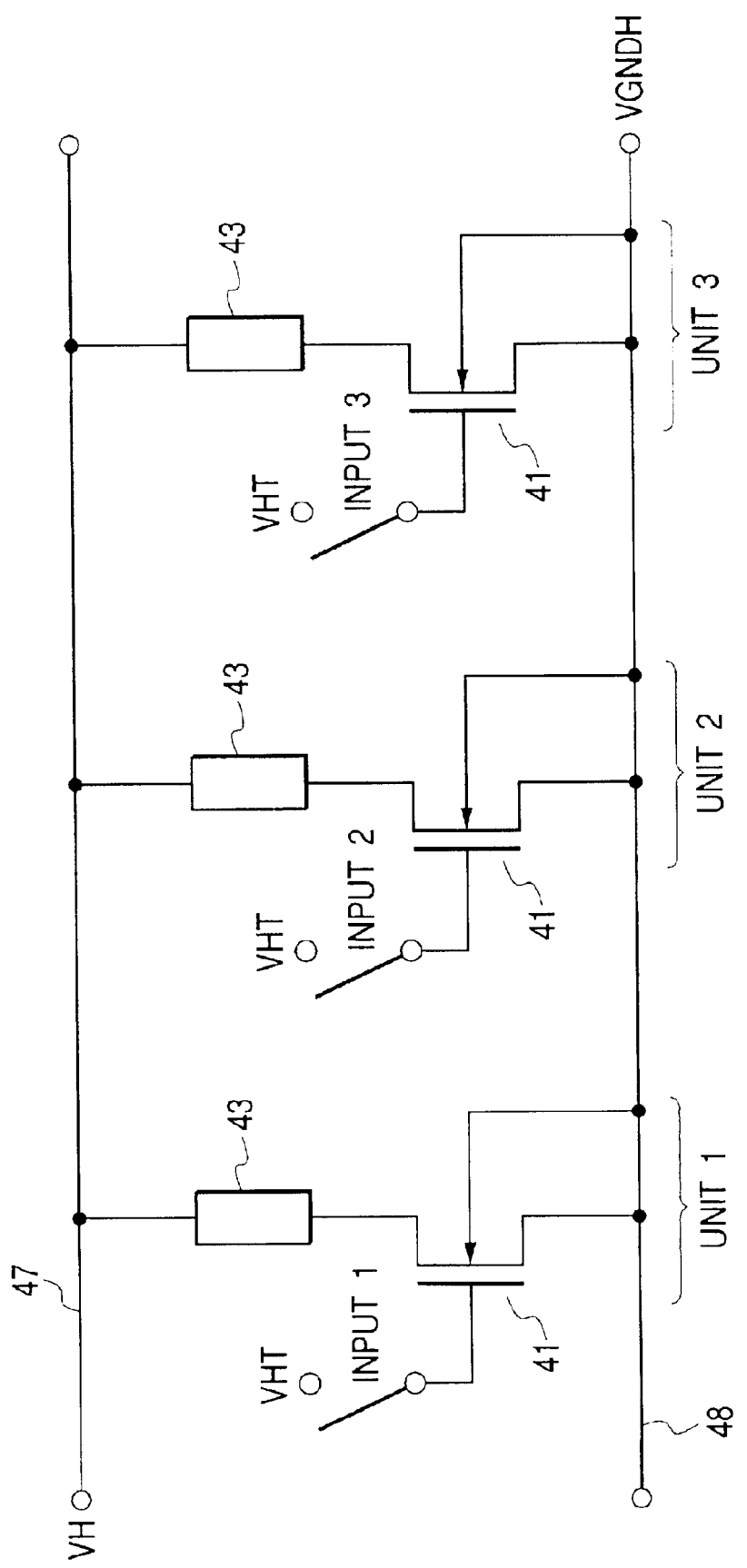
FIG. 4 is a diagram for explaining the operation of a semiconductor device in accordance with one embodiment of the present invention.

FIG. 4 shows the outline of a circuit that can selectively drive a plurality of loads, and shows portions corresponding to three units. Each of these units includes the load 43, the switching element 41 that allows a current to flow in the load 43, and a switch for driving the switching element 41.

As described above with reference to FIG. 2, when a drive voltage VHT of an intermediate level is applied to the gate of the switching element 41, the switching element 41 turns on and a current flows in the load 43 connected to the switching element 41.

As a result, when the units are arranged on the semiconductor substrate in an array, these can be used as a recording device that utilizes heat.

Next, a process of manufacturing a semiconductor device in accordance with this embodiment will be described.

Figure 5A:
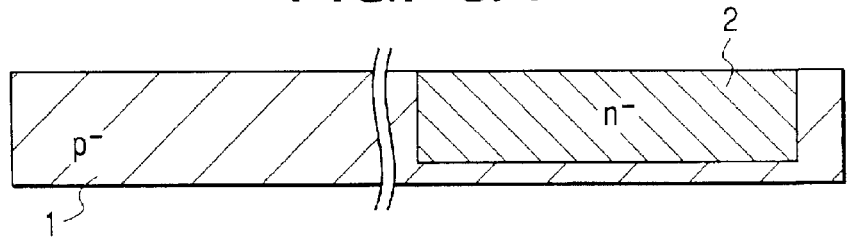
FIGS. 5A, 5B, 5C, 5D and 5E are cross-sectional views showing a process of manufacturing a semiconductor device in accordance with a first embodiment of the present invention.

FIGS. 5A, 5B, 5C, 5D and 5E are cross-sectional views of each of steps for manufacturing the semiconductor device used in the present invention. As shown in FIG. 5A, the n-type well region 2 is formed on the surface of the p-type semiconductor substrate 1. The n-type well region 2 is selectively formed on the p-type semiconductor substrate 1 by using the ion implantation method or the like. Also, a p-type well region can be selectively formed by forming the n-type well region 2 on the entire surface of the p-type semiconductor substrate 1 by using an epitaxial growth method.

Figure 5B:
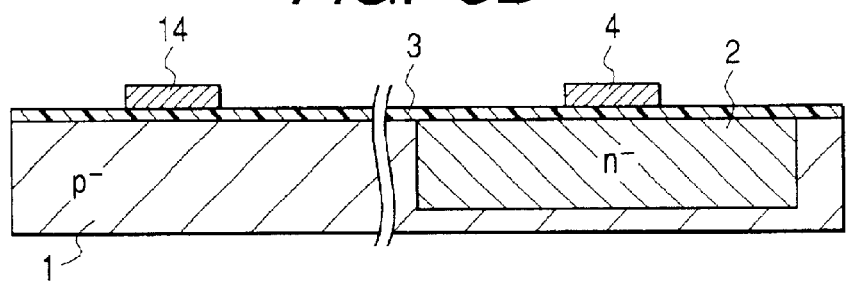

Then, as shown in FIG. 5B, a gate oxide film 3 of about 50 nm in film thickness is allowed to grow on the n-type well region 2 through, for example, hydrogen burning oxidation, and polycrystal silicon of about 300 nm in film thickness is deposited on the gate oxide film 3 through, for example, LPCVD (low pressure chemical vapor deposition) method. The polycrystal silicon may be doped with, for example, phosphorus at the same time when the polycrystal silicon is deposited through the LPCVD method, or it may be doped with, phosphorus by using, for example, the ion implantation method or the solid-phase diffusion method after the deposition, to thereby obtain a desired wiring resistance. Thereafter, patterning is conducted by photolithography to etch the polysilicon film. As a result, gate electrodes 4 and 14 of the MIS field effect transistor can be formed. At this time, the first gate electrode 4 is formed on the first n-type well region 2, and the second gate electrode 14 is formed on the surface of the semiconductor substrate.

Figure 5C:
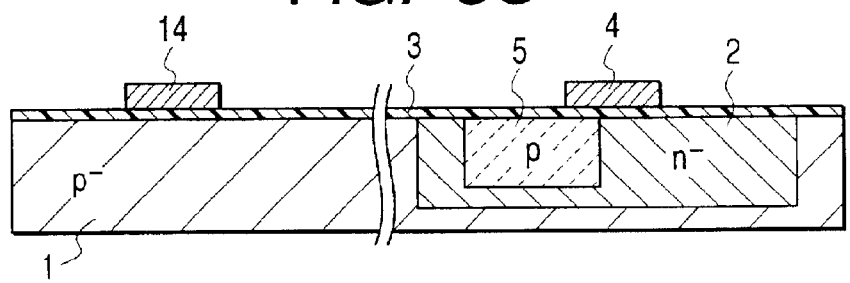

Then, as shown in FIG. 5C, a photo resist (not shown) is coated, and patterning is conducted through photolithography. Also, p-type impurities, for example, boron, is selectively ion-implanted with the gate electrode 4 as a mask, and a heat treatment is conducted in an electric furnace at 1100° C. for 60 minutes, for example, to form the base region 5 within the well region 2. The condition of heat treatment is determined in accordance with the depth and concentration of the well region 2 and the kind of impurities to be contained therein, as well as the concentration of the base region 5 and the kind of impurities to be contained therein, because the heat treatment determines the channel region of the DMOS transistor 20.

Figure 5D:
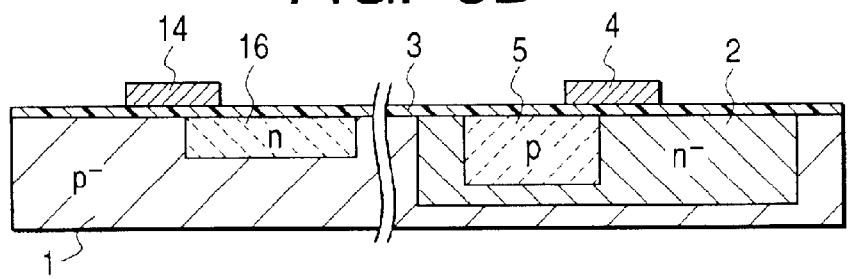

Subsequently, as shown in FIG. 5D, a photo resist (not shown) is coated, patterning is conducted by photolithography, and n-type impurities, for example, phosphorus, is selectively ion-implanted with the gate electrode 14 as a mask to form the field relaxation drain region 16 that is aligned with the right end portion of the gate electrode 14. The field relaxation drain region 16 is a main element in determining the breakdown voltage and the on-resistance value of the MOS transistor 30. For that reason, in order to obtain desired concentration and depth thereof, a heat treatment may be conducted in an electric furnace at 1000° C. for 30 minutes, for example.

Figure 5E:
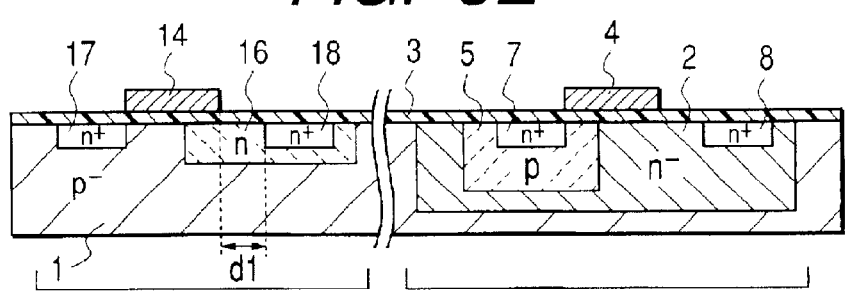

Then, as shown in FIG. 5E, the first source region 7, the first drain region 8, the second source region 17 and the second drain region 18 are formed by ion-implanting, for example, arsenic and then conducting a heat treatment in an electric furnace at 950° C. for 30 minutes. Here, the first source region 7 is formed by ion-implantation with the gate electrode as a mask, so that the first source region 7 can be formed in a self-alignment manner with respect to the gate electrode.

Thereafter, although not shown, an oxide film is deposited through the CVD method to form an interlayer insulating film, a contact is opened and a wiring is connected to complete an integrated circuit. As occasion demands, a multi-layer wiring may be used. While the wiring portion is prepared, an electro-thermal converter that functions as a load can be formed together.

A more detailed manufacturing method of a main portion will be described. The MOS transistor 30 may be allowed to have higher on resistance value than the DMOS transistor 20, without causing any problem. This is because it is not necessary to allow a large current to flow in the case of the MOC transistor 30. For that reason, the appropriate amount of ion implantation for forming the field relaxation drain region 16 is about $1/10$ to $1/10000$ of that performed for forming the second drain region 18, and its depth is sufficient at about $2/3$ to $1/10$ of that of the base region 5.

Also, the second drain region 18 is formed apart from the gate electrode 14 by a distance d1. The distance d1 is not constant due to the need to take balancing with the DMOS transistor 20, but the appropriate distance may be about 1.0 to 5.0 μm.

Figure 6A:
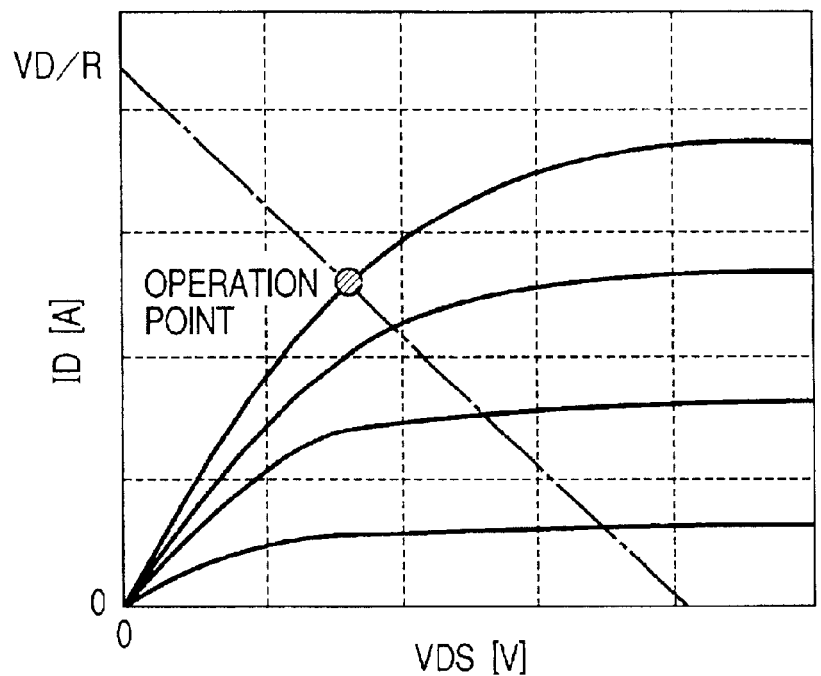
FIGS. 6A and 6B are graphs showing the electric characteristic of a DMOS transistor used in the present invention.
Figure 6B:
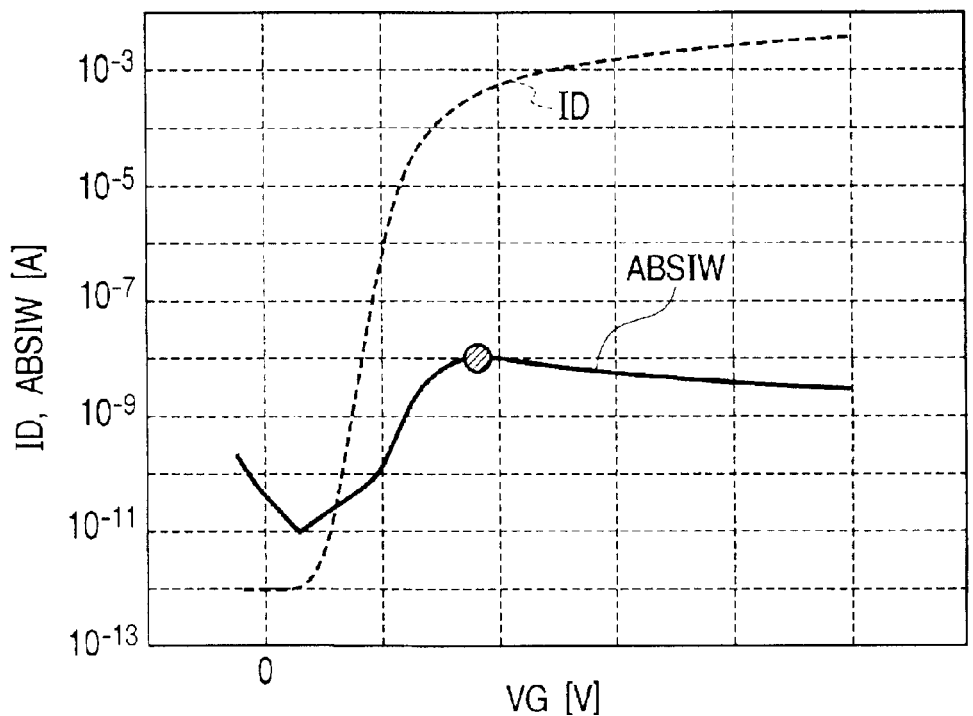
Figure 7A:
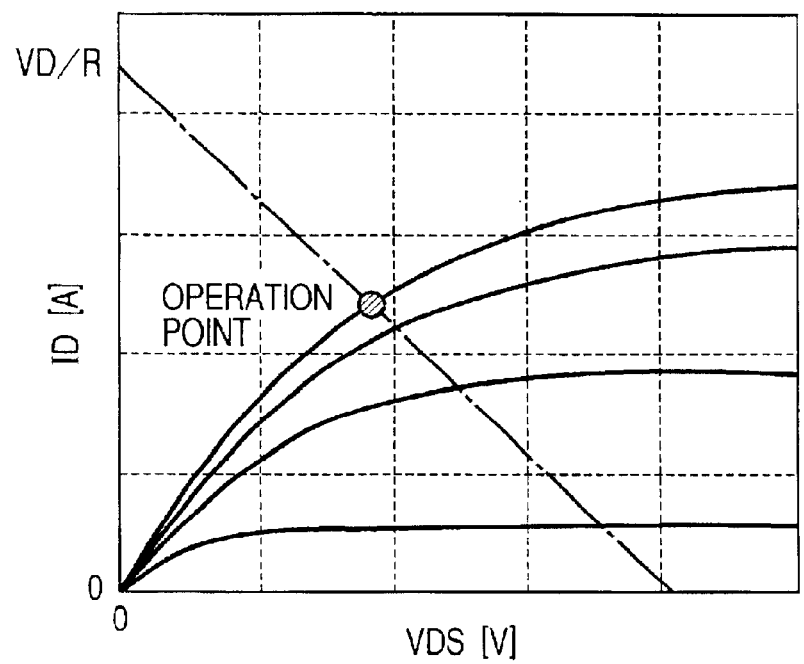
FIGS. 7A and 7B are graphs showing the electric characteristic of an MOS transistor used in the present invention.
Figure 7B:
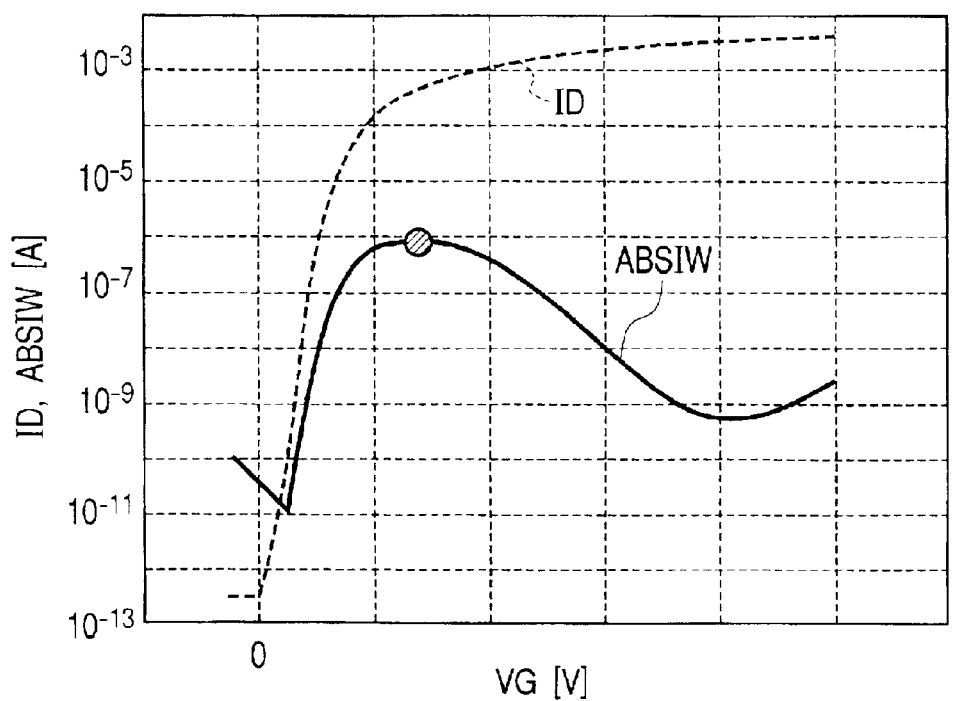

The VDS-ID (drain voltage to drain current) characteristic, the VG-ID (gate voltage to drain current) characteristic, and the VG-ABSIW (gate voltage to wafer current absolute value) characteristic of the DMOS transistor 20 thus prepared are shown in FIGS. 6A and 6B. Similarly, the VDS-ID characteristic, and the VG-ID and ABSIW characteristics of the MOS transistor 30 are shown in FIGS. 7A and 7B. As is apparent from the drawings, the operation range of the MIS field effect transistor is thus controlled by a load resistor R, and its operation breakdown voltage is determined by the maximum value within the operation range of the substrate (wafer) current value represented by ABSIW.

The MOS transistor 30 prepared as described above has an on-resistance value that is equal or higher, and an operation breakdown voltage that is $2/3$ or lower, as compared with those of the DMOS transistor 20. Also, compared with the DMOS transistor 20, the MOS transistor 30 has an on-resistance that is equal or higher, and the maximum substrate current value thereof is 10 times or more higher.

In other words, the DMOS transistor 20 has a low on-resistance, high breakdown voltage and low substrate current, the DMOS transistor 20 is preferable as the switching element.

(Second Embodiment)

This embodiment modifies the structure of the DMOS transistor that constitutes the switching element in the above-mentioned embodiment. Structures other than this are identical with those in the above-mentioned embodiment.

Figure 8:
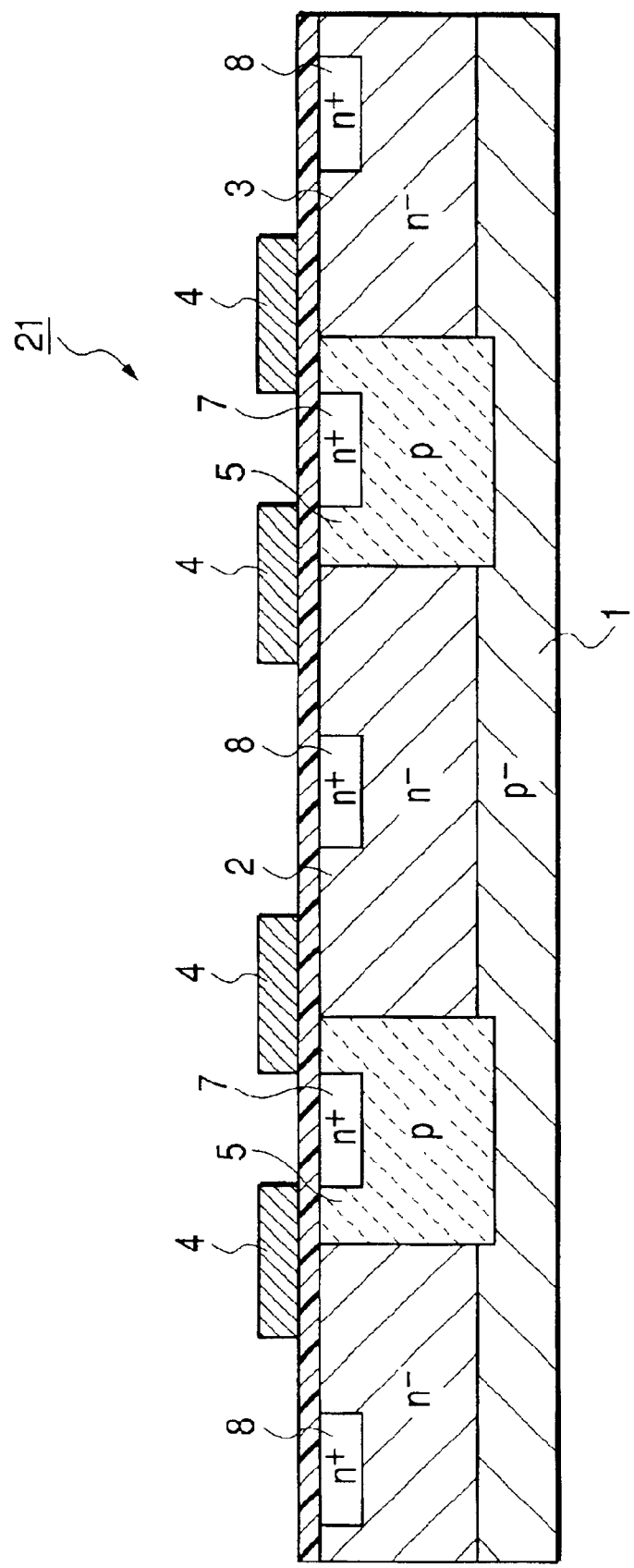
FIG. 8 is a cross-sectional view showing a DMOS transistor used in the present invention.

FIG. 8 shows a cross-section of a portion of a switching element array. In the DMOS transistor 21 used in this embodiment, the base region 5 is formed deeply so as to reach the p-type region of the substrate, in order to completely isolate the well region 2 in a lateral direction. With this structure, the drains of the respective segments can be electrically isolated from each other.

Therefore, since a dedicated element separation region is not required between the adjacent units as in the structure of FIG. 3, an occupied area is small, and the degree of freedom of a design when connecting the MDOS transistors in parallel with each other is also high.

FIGS. 9A, 9B, 9C, 9D and 9E are cross-sectional views for explaining each of steps for manufacturing a semiconductor device according to the second embodiment of the present invention.

Figure 9A:
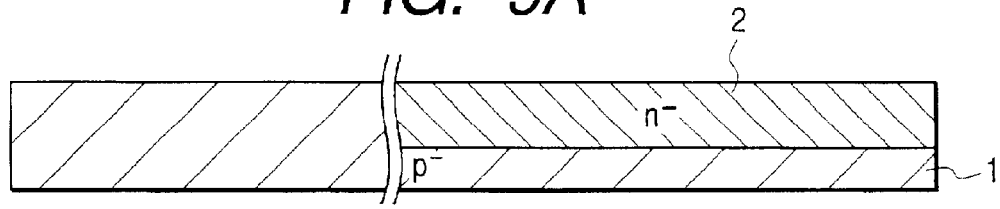
FIGS. 9A, 9B, 9C, 9D and 9E are cross-sectional views showing a process of manufacturing a semiconductor device in accordance with a second embodiment of the present invention.
Figure 9B:
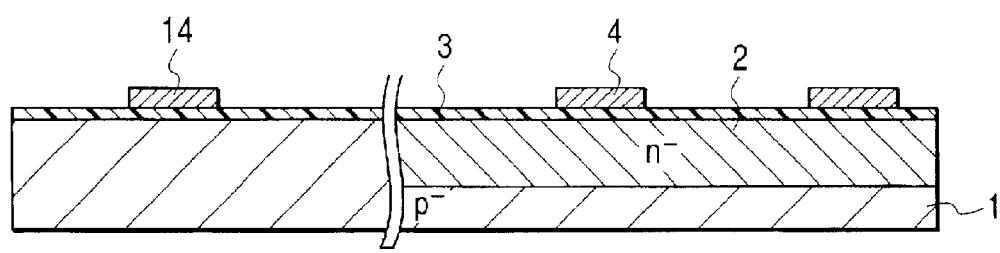

The steps shown in FIGS. 9A and 9B are identical with those in the first embodiment, and therefore only the steps to be performed thereafter will be described here.

Figure 9C:
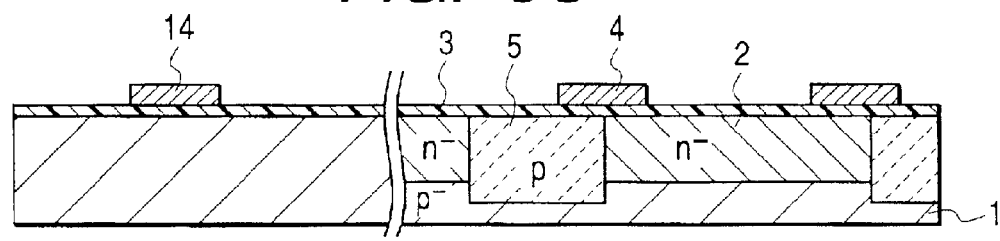

A photo resist (not shown) is coated, and patterning is conducted through photolithography. Also, p-type impurities, for example, boron, is selectively ion-implanted with the gate electrode 4 as a mask, and a heat treatment is conducted in an electric furnace, for example, at 1100° C. for 180 minutes, to form the base region 5 for electrically isolating the well region 2 (FIG. 9C). In the heat treatment, it is important to design the base region 5 to be deeper than the well region 2 so as to isolate the well region 2 and the condition of the heat treatment is determined in accordance with the depth and concentration of the well region 2 and the kind of impurities to be contained therein, as well as the concentration of the base region 5 and the kind of impurities to be contained therein. The concentration of impurities in the uppermost surface of the base region 5 can be selected from, for example, $1\times10^{15}/cm^3$ to $1\times10^{19}/cm^3$.

Figure 9D:
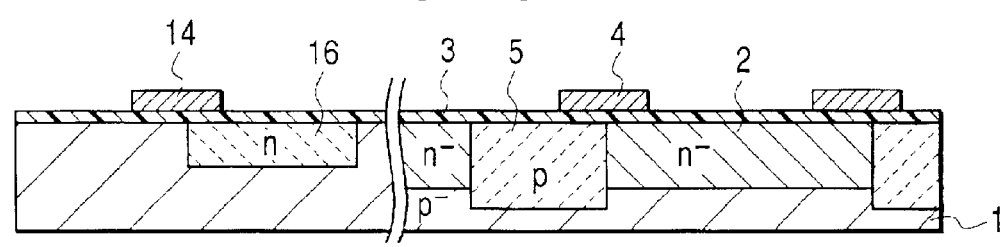

Subsequently, a photo resist (not shown) is coated, patterning is conducted by photolithography, and n-type impurities, for example, phosphorus, is selectively ion-implanted with the gate electrode 14 as a mask to form the field relaxation drain region 16 that is aligned with the right end portion of the gate electrode 14 (FIG. 9D). The field relaxation drain region 16 is a main element in determining the breakdown voltage and the on-resistance of the MOS transistor 30. For that reason, in order to obtain desired concentration and depth thereof, a heat treatment may be conducted in an electric furnace, for example, at 1000° C. for 30 minutes.

Figure 9E:
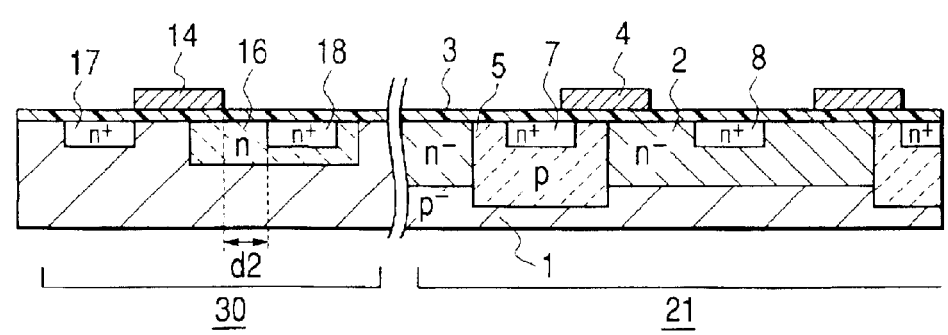

Then, as shown in FIG. 9E, the first source region 7, the first drain region 8, the second source region 17 and the second drain region 18 are formed by ion-implanting, for example, arsenic and then conducting a heat treatment in an electric furnace at 950° C. for 30 minutes. When the first source region 7 and the second source region 17 are formed by ion-implantation with the gate electrode as a mask, the first source region 7 and the second source region 17 may be formed in a self-alignment manner with respect to the gate electrode. A distance d2 may be designed in the same manner as the above-mentioned distance d1.

Thereafter, although not shown, an oxide film is deposited through the CVD method to form an interlayer insulating film, a contact is opened and a wiring is connected. As occasion demands, a multi-layer wiring may be used to thereby complete an integrate circuit. While the wiring portion is prepared, a load such as an electro-thermal converter is formed together.

According to this embodiment, because of the structure where the base region 5 is formed deeply so as to isolate the well region 2, the drains of the respective segments can be electrically isolated from each other. As a result, even in the case where the semiconductor device according to the present invention has an arrayed configuration, the semiconductor device can be realized with a simple circuit structure shown in FIG. 4, thereby achieving reduced costs.

As described above, in the semiconductor device and its manufacturing method according to this embodiment, because the N-type dopant concentration of the drain of the switching element can be set to be lower than the p-type dopant concentration of the channel, and the drain can be formed so as to be sufficiently deep, a large voltage can be allowed to flow due to a high breakdown voltage, and high-speed operation and a large current flow can be allowed due to the low on-resistance, thereby achieving higher integration and energy saving. Also, because the circuit for driving the switching element has an element of an intermediate breakdown voltage which has an analog characteristic, a semiconductor device which can be freely designed and high in performance can be realized without remarkably increasing the manufacture costs.

The liquid jet head according to this embodiment of the present invention can be fabricated by forming a heating resistant member (electro-thermal converter) having a wiring made of aluminum or the like and a heating resistant layer made of tantalum nitride or the like, on an insulating layer (not shown) of the semiconductor device manufactured as described above, and combining therewith a discharge opening formation member such as a ceiling made of a mold resin or a film in order to form the discharge opening and an ink passage that communicates with the discharge opening (see FIG. 20). Then, when a liquid containing tank is connected and mounted on the device main body, and a supply voltage is applied from a power circuit to the device, the device operates as the liquid jet apparatus such as an ink jet printer.

(Third Embodiment)

Figure 10A:
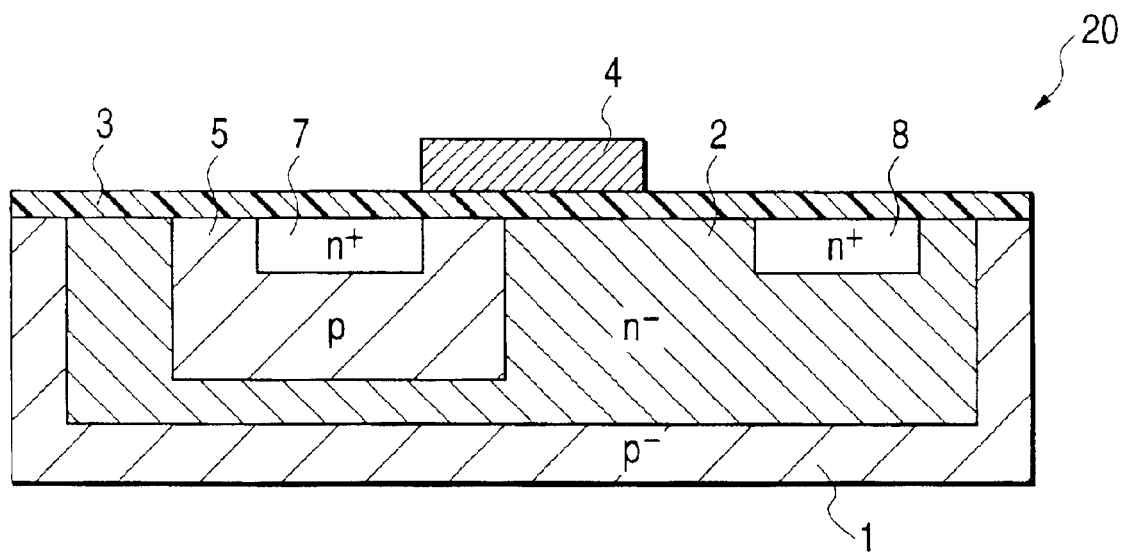
FIG. 10A is a cross-sectional view showing a switching element used in the present invention.
Figure 10B:
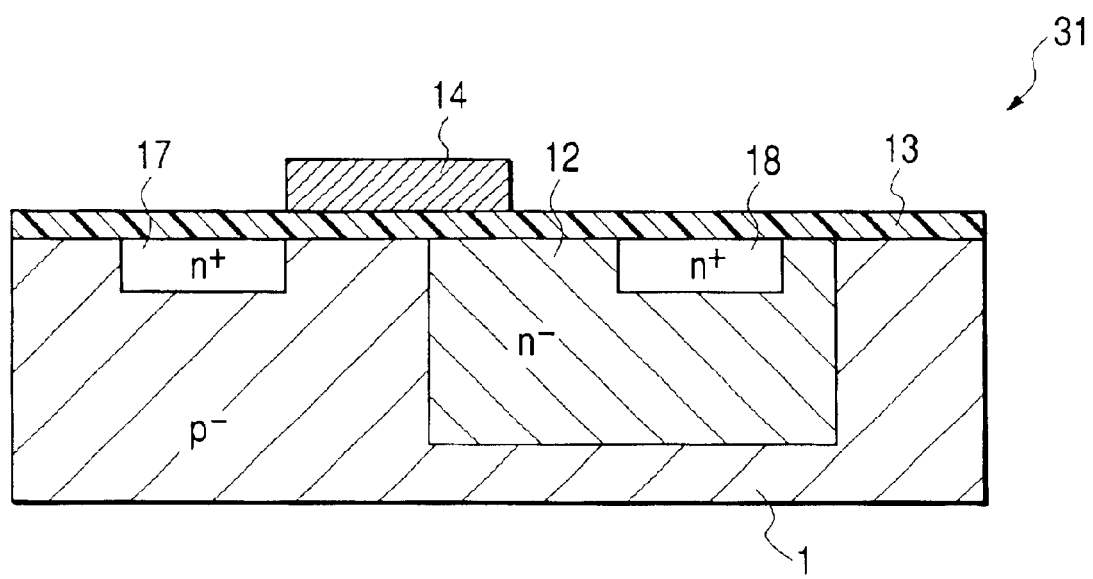
FIG. 10B is a cross-sectional view showing a drive circuit element used in the present invention.

Next, another embodiment of the present invention will be described with reference to the accompanying drawings. FIGS. 10A and 10B are cross-sectional structural views of the switching element and the drive circuit element in accordance with the present invention, respectively, and FIGS. 11A, 11B, 11C and 11D are schematic views for explaining a process of manufacturing these elements.

FIG. 10A shows an example of the switching element used in the present invention, which is identical in structure with that shown in FIG. 1A.

FIG. 10B shows elements contained in the circuit for driving the switching element shown in FIG. 10A, in which reference numeral 1 denotes a semiconductor substrate of a first conductive type, 12 is a well region that is a first semiconductor region of a second conductive type, 13 is a gate insulating film, 14 is a gate electrode, 17 is a source region aligned with the left end portion of the gate electrode, and 18 is a high-concentration drain region that is formed laterally apart from the gate electrode.

The MOS transistor 31 has a well region 12 that operates as a lightly doped drain on the drain region 18 side, and includes the highly doped drain region 18 that is formed apart from a pn junction between the channel and the lightly doped drain region and also apart from the highly doped drain region 18 apart from the gate electrode. Breakdown voltages between the source and the drain and between the drain and the channel can be set to be higher than those in the conventional MOS transistor in which the source and drain regions are formed in a self-alignment manner with respect to the gate electrode. Also, since the element can be formed with the same depth and at the same concentration of impurities as those of the well region 2 in the DMOS transistor 20, the field relaxation drain region 12 can be formed simultaneously with the well region 2 of the DMOS transistor 20. Therefore, even if the region 12 is formed, the number of masks and the manufacture costs are not increased.

Also, because the channel length can be freely designed, an arbitrary threshold voltage can be set, and an analog characteristic capable of withstanding the high voltage can be imparted, thereby achieving freedom of design.

Then, the offset MOS transistors 31 shown in FIG. 10B can be integrated together by using a common substrate such as a silicon substrate as in the transistors shown in FIG. 10A. As a result, the simple circuit structure shown in FIG. 2 can be realized.

The offset MOS transistor according to this embodiment is suitably used as a transistor that constitutes a high voltage CMOS circuit or a level shift circuit.

Figure 11A:
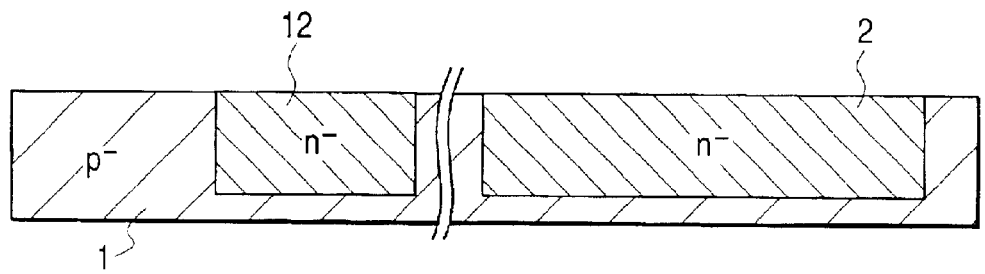
FIGS. 11A, 11B, 11C and 11D are cross-sectional views showing a process of manufacturing a semiconductor device in accordance with a third embodiment of the present invention.

FIGS. 11A, 11B, 11C and 11D are cross-sectional views of each of steps for manufacturing a semiconductor device in accordance with a third embodiment of the present invention. As shown in FIG. 11A, a first n-type well region 2 and a second n-type well region 12 are formed on the surface of the p-type semiconductor substrate 1. The n-type well regions 2 and 12 are selectively formed on the p-type semiconductor substrate 1. Also, a common epitaxial layer that becomes the n-type well regions 2 and 12 is formed on the entire surface of the p-type semiconductor substrate 1 through the epitaxial growth method, and a p-type well region is selectively formed in the common epitaxial layer, thereby isolating the n-type well regions 2 and 12 from each other.

Figure 11B:
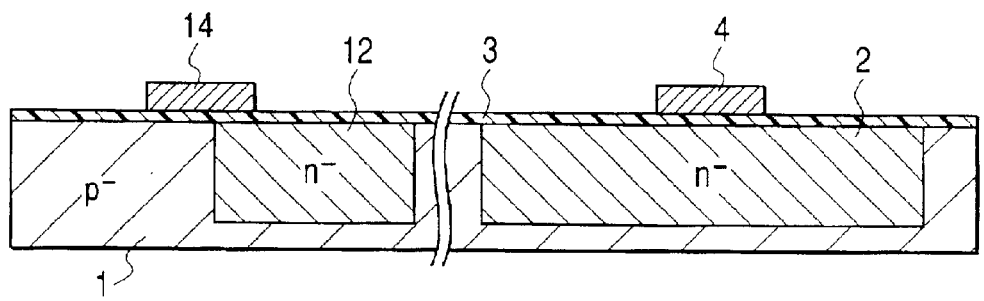

Subsequently, as shown in FIG. 11B, the gate insulating film 3 made of silicon oxide and of about 50 nm in film thickness is allowed to grow on the n-type well region 2 through, for example, hydrogen burning oxidation, and polycrystal silicon about 300 nm in film thickness is deposited on the gate oxide film 3 through, for example, LPCVD (low pressure chemical vapor deposition) method. The polycrystal silicon may be doped with, for example, phosphorus at the same time when the polycrystal silicon is deposited through the LPCVD method, or may be doped with phosphorus after the deposition by using, for example, the ion implantation method or the solid-phase diffusion method, to thereby obtain a desired wiring resistance. Thereafter, patterning is conducted by photolithography to etch the polysilicon film. As a result, the first gate electrode 4 of the DMOS transistor 20 and the gate electrode 14 of the offset MOS transistor 31 can be formed. At this time, it is necessary that the first gate electrode 4 is formed on the first n-type well region 2, and the second gate electrode 14 is formed on the surface at which the pn junction between the second n-type well region 12 and the semiconductor substrate 1 terminates.

Figure 11C:
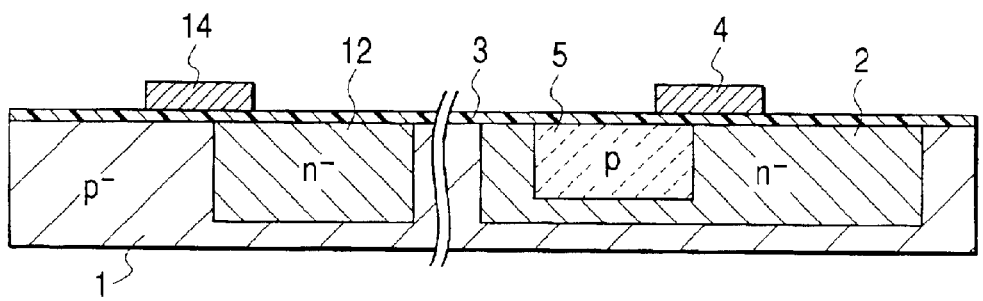

Then, a photo resist (not shown) is coated, and patterning is conducted through photolithography. Also, p-type impurities, for example, boron, is selectively ion-implanted with the gate electrode 4 as a mask, and a heat treatment is conducted in an electric furnace at 1100° C. for 60 minutes, for example, to form the base region 5 within the well region 2 (FIG. 11C). The temperature or duration of the heat treatment is determined in accordance with the depth and concentration of the well region 2 and the kind of impurities to be contained in the well region 2, as well as the concentration of the base region 5 and the kind of impurities to be contained in the base region 5, because the heat treatment determines the channel region of the DMOS transistor 20.

Figure 11D:
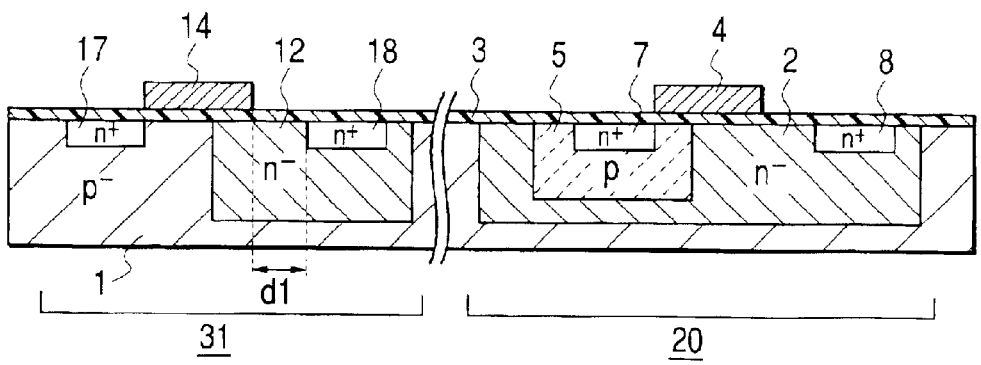

Subsequently, as shown in FIG. 11D, the first source region 7, the first drain region 8, the second source region 17 and the second rain region 18 are formed by ion-implanting, for example, arsenic and conducting a heat treatment in the electric furnace at 950° C. for 30 minutes, for example. Since the first source region 7 and the second source region 17 are both formed by ion-implantation with the gate electrode as a mask, the first source region 7 and the second source region 17 can be formed in a self-alignment manner with respect to the gate electrode.

Thereafter, although being not shown, an interlayer insulating film is formed by depositing an insulating material such as an oxide film through the CVD method, a contact is opened, a wiring is formed, and the respective elements are wired to thereby complete an integrated circuit. As occasion demands, a multi-layer wiring may be used. While preparing the wiring portion, a load such as an electro-thermal converter is prepared together.

According to this embodiment, because the field relaxation drain region of the offset MOS transistor 31 shown in FIG. 11 can be formed by the second n-type well region 12, an element of intermediate breakdown voltage which have an analog characteristic can be provided in a circuit for driving the switching element without increasing the mask, thereby realizing the semiconductor device which can be freely designed and high in performance.

Now, a more detailed manufacturing method of the main portion will be described. There is no problem in setting the on-resistance of the transistor 31 to be higher than that of the DMOS transistor 20. This is because it is unnecessary to make a large current flow in the transistor 31. Also, there should arise no problem as far as an operation breakdown voltage of some reasonable degree is ensured. For that reason, the appropriate amount of ion implantation for forming the well region 12 is about $1/10$ to $1/10000$ of that for forming the second drain region 18, and may be set by mainly considering the characteristic of the DMOS transistor 20.

Also, the second drain region 18 is formed apart from the gate electrode 14 by a distance d1. The distance d1 may be appropriately set at about 1.0 to 5.0 μm.

The VDS-ID (drain voltage to drain current) characteristic, the VG-ID (gate voltage to drain current) characteristic, and the VG-ABSIW (gate voltage to wafer current absolute value) characteristic of the DMOS transistor thus prepared are identical with those shown in FIGS. 6A and 6B. Similarly, the VDS-ID characteristic, and the VG-ID and ABSIW characteristics of the MOS transistor 30 are substantially identical with those shown in FIGS. 7A and 7B.

(Fourth Embodiment)

This embodiment modifies the structure of the DMOS transistor that constitutes the switching element in the above-mentioned embodiments. Structures other than this are identical with those in the third embodiment.

The cross-section of the portion of the switching element array in a semiconductor device according to this embodiment is identical with that shown in FIG. 8. In the DMOS transistor 21 used in this embodiment, the base region 5 is formed deeply so as to reach the p-type region of the substrate, so that the well region 2 can be completely isolated in a lateral direction. Because of this structure, the drains of the respective segments can be electrically isolated from each other.

Therefore, since a dedicated element isolation region is not required as in the structure shown in FIG. 3 or 11, an occupied area is small, and the degree of freedom of a design in the case where the DMOS transistors are connected in parallel with each other is also high.

FIGS. 12A, 12B, 12C and 12D are schematic cross-sectional views for explaining a process of manufacturing a semiconductor device in accordance with a fourth embodiment of the present invention.

Figure 12A:
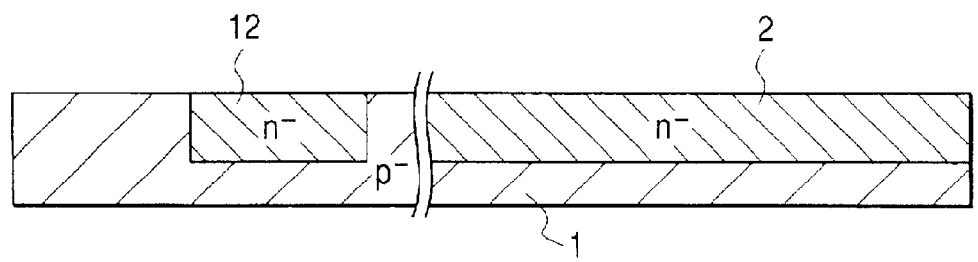
FIGS. 12A, 12B, 12C and 12D are cross-sectional views showing a process of manufacturing a semiconductor device in accordance with a fourth embodiment of the present invention.

As shown in FIG. 12A, a semiconductor substrate 1 such as p-type mono-crystal silicon is prepared, and n-type impurities such as phosphorus or arsenic are introduced into the semiconductor substrate 1 to form n-type well regions 2 and 12 at the same time. Alternatively, after an n-type epitaxial layer has been formed, p-type impurities may be introduced into the periphery of the well regions to form a p-type well separation region.

Figure 12B:
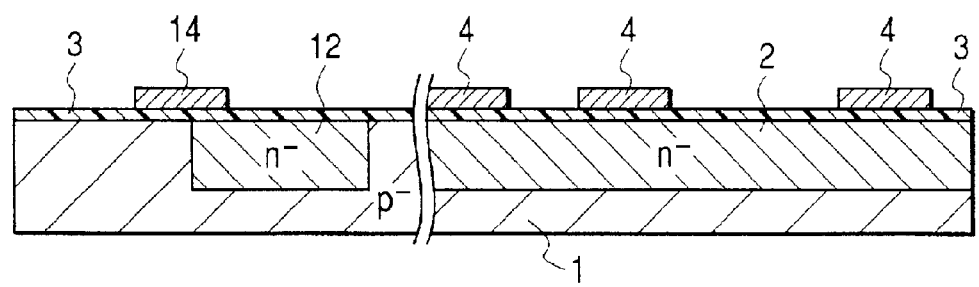

As shown in FIG. 12B, after the surface of the substrate is oxidized to form the gate insulating film 3, the gate electrodes 4 and 14 are formed in the same process.

Figure 12C:
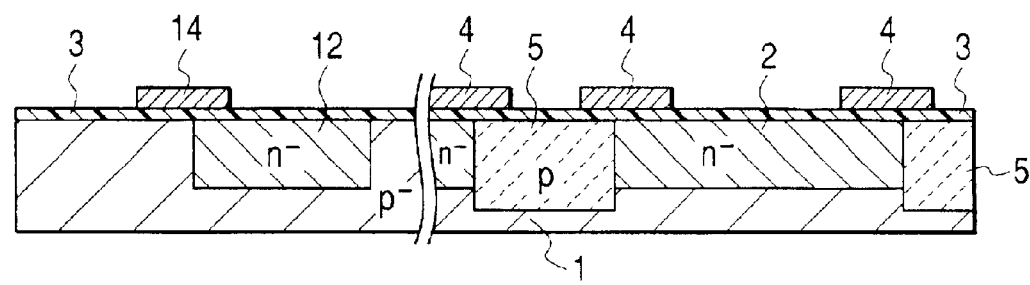

A photo resist (not shown) is coated, and patterning is conducted through photolithography. Also, p-type impurities, for example, boron, is selectively ion-implanted with the gate electrode 4 as a mask, and a heat treatment is conducted in an electric furnace, for example, at 1100° C. for 180 minutes, to form the base region 5 so as to be electrically isolated from the well region 2 (FIG. 12C). It is important that the heat treatment be adapted such that the base region 5 is formed to be deeper than the well region 2 so as to isolate the well region 2, and the condition of the heat treatment is determined in accordance with the depth and concentration of the well region 2 and the kind of impurities to be contained in the well region 2, as well as the concentration of the base region 5 and the kind of impurities to be contained in the base region 5.

Figure 12D:
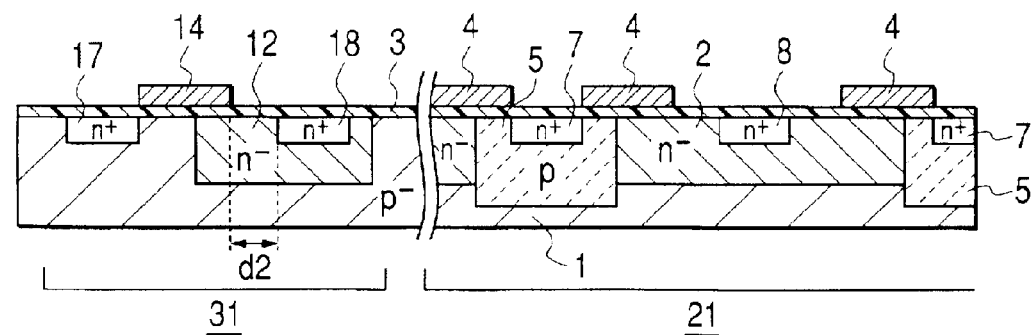

Then, as shown in FIG. 12D, the first source region 7, the first drain region 8, the second source region 17 and the second drain region 18 are formed simultaneously by ion-implanting, for example, arsenic and then conducting a heat treatment in an electric furnace at 950° C. for 30 minutes, for example. The first source region 7 and the second source region 17 are formed by ion-implantation with the gate electrode as a mask, the first source region 7 and the second source region 17 can be formed in a self-alignment manner with respect to the gate electrode. A distance d2 may be designed in the same manner as the above-mentioned distance d1.

Thereafter, although not shown, an oxide film is deposited through the CVD method to form an interlayer insulating film, a contact is opened and a wiring is connected. As occasion demands, a multi-layer wiring may be used to complete an integrate circuit. While preparing the wiring portion, a load such as an electro-thermal converter is formed together.

According to this embodiment, because of the structure in which the base region 5 is formed deeply so as to isolate the well region 2, the drains of the respective segments can be electrically isolated from each other. As a result, even in the case where the semiconductor device according to the present invention is arranged in an array and used as a recording device, a simple circuit structure such as shown in FIG. 4 can be realized, thereby achieving cost reduction.

As described above, in the semiconductor device and its manufacturing method according to this embodiment, because the N-type dopant concentration of the drain of the switching element can be set to be lower than the P-type dopant concentration of the channel, and the drain can be formed to be sufficiently deep, a large voltage can be allowed to flow due to a high breakdown voltage, and high-speed operation and a large current flow can be allowed due to the low on resistance, thereby attaining higher integration and energy saving. Also, because the circuit for driving the switching element includes an element having an intermediate breakdown voltage and an analog characteristic, a semiconductor device which can be freely designed and high in performance can be realized without remarkably increasing the manufacture costs.

(Fifth Embodiment)

This embodiment improves the array of the DMOS transistor, and its plain structure is shown in FIG. 13. In this example, only two units in the semiconductor device having a large number of units are shown.

In this embodiment, in the DMOS transistors that are made adjacent to each other without provision of a dedicated element separation region being interposed therebetween, three adjacent drains are commonly connected to each other and are then connected to a load 43 such as one electro-thermal converter.

The sources are commonly connected in all of the DMOS transistors.

The respective sources are arranged on both sides of those three drains through the gate electrodes. The source is short-circuited to the base region that provides the channel of the DMOS transistor. Further, as for the cross-sections of the DMOS transistors in their arrangement direction, a predetermined pattern shown in FIG. 8 is repeated regardless of where the cross-sections are taken within the unit or in the adjacent units.

(Sixth Embodiment)

Figure 14:
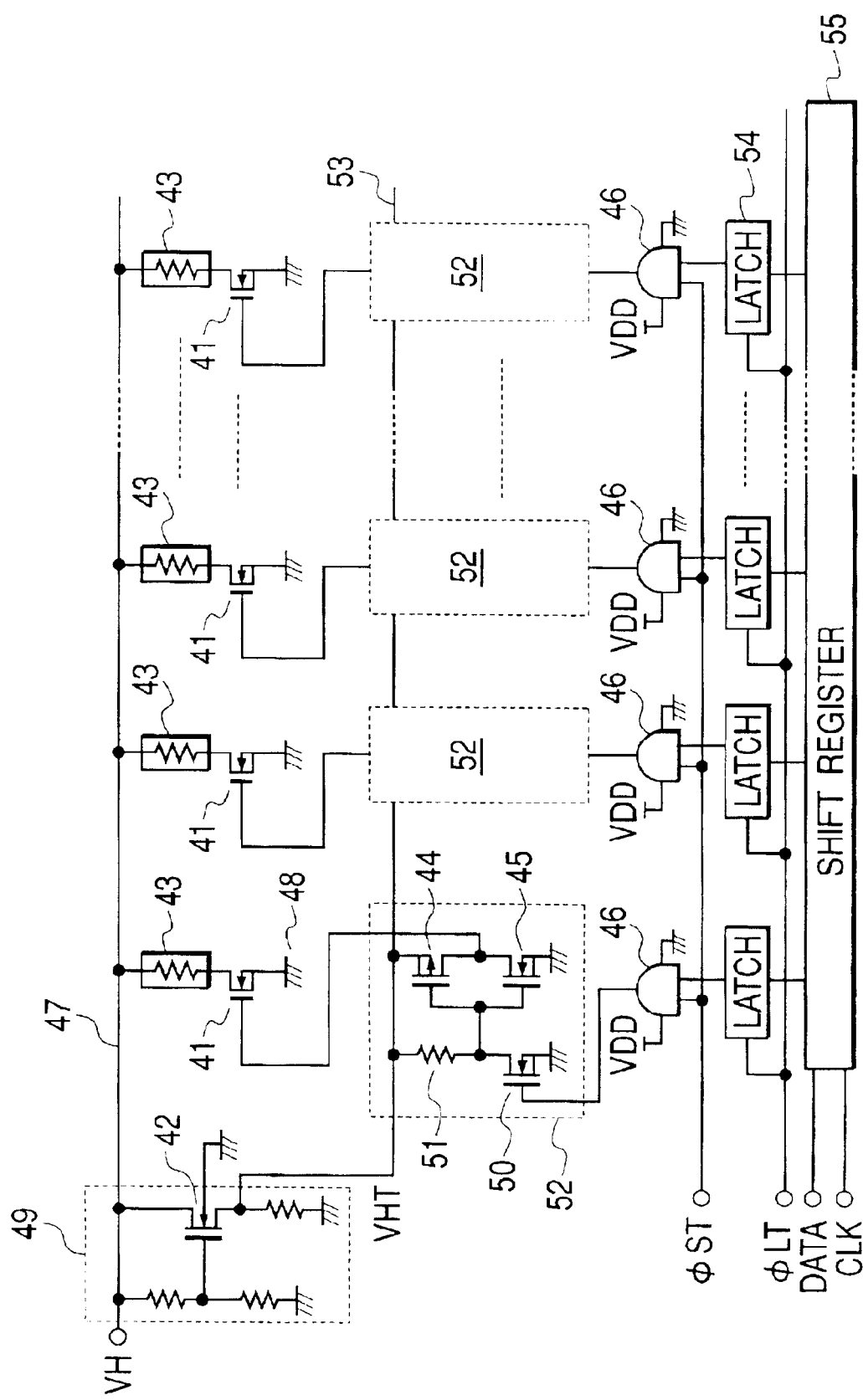
FIG. 14 is a circuit diagram showing a semiconductor device in accordance with a sixth embodiment of the present invention.

The circuit structure of a semiconductor device according to this embodiment is shown in FIG. 14.

Referring to FIG. 14, reference numeral 43 denotes a load such as an electro-thermal converter, and a DMOS transistor such as shown in FIG. 13 is connected as the switching element 41 between the load 43 and a low-potential side wiring 48 to which a lower reference voltage VGNDH is applied.

In this example, as an example of a circuit that drives the switching element 41, there is adopted a circuit structure having a level shift circuit 49, a CMOS circuit 52 and a logic circuit 46, and also having a latch 54 and a shift register 55.

The gate of the switching element 41 is connected with a high-voltage CMOS circuit 52 having a pMOS transistor 44 and an nMOS transistor 45, and an input terminal of the CMOS circuit is connected with a logic circuit 46 formed of an AND gate. The higher potential side of the CMOS circuit is connected with a level shift circuit 49 that gives an intermediate reference voltage VHT.

As the level shift circuit 49, there is used a source follower circuit of the MOS transistor 42 such as shown in the figure. The level shift circuit 49 generates a reference voltage VHT that is lower than the higher reference voltage VHH supplied from the higher potential side wiring 47 by about several volts to ten and several volts.

The reference voltage VHT can be applied to the gate of the switching element 41 through the pMOS transistor 44 of the higher-voltage CMOS circuit 52.

The higher-voltage CMOS circuit 52 is controlled by a logic circuit such as the AND gate 46. This logic circuit can be also structured by a CMOS circuit. Since the drive voltage VDD of the AND gate 46 is further lower than the reference voltage VHT, the logic circuit can be structured by a lower-voltage CMOS.

In this example, as the nMOS transistor 45 among the transistors that constitutes the higher-voltage CMOS circuit 52, there is used a DMOS transistor. In addition, it is preferable that the transistor 50 is also formed of a DMOS transistor as in case of the nMOS transistor 45.

The transistor used in the logic circuit such as the AND gate 46 is formed not of a DMOS transistor but of an MOS transistor having a source region and a drain region which are self-aligned to the gate electrode.

In addition, the source follower transistor 42 in the level shift circuit 49 is made up of an offset MOS transistor having an intermediate breakdown voltage, such as that shown in FIG. 1B or 10B.

As described above, the high-breakdown voltage DMOS transistor is used as the switching element 41, and the transistors 45 and 50 in one of the CMOS circuits 52 that supply a voltage to the gate of the switching element, among the circuits for driving the switching element 41, is made up of a higher-breakdown voltage DMOS transistor which is manufactured in the same manufacture process as that of the DMOS transistor for the switching element 41.

Then, an offset MOS transistor having an intermediate breakdown voltage is used as the source follower element 42 of the level shift circuit 49, and a low-breakdown-voltage MOS transistor is used as a logic circuit that has a low supply voltage.

As a result, a highly reliable semiconductor integrated circuit having both analog and logic can be inexpensively provided which allows high-speed operation, and is high in the load drive capacity.

(Seventh Embodiment)

Figure 15:
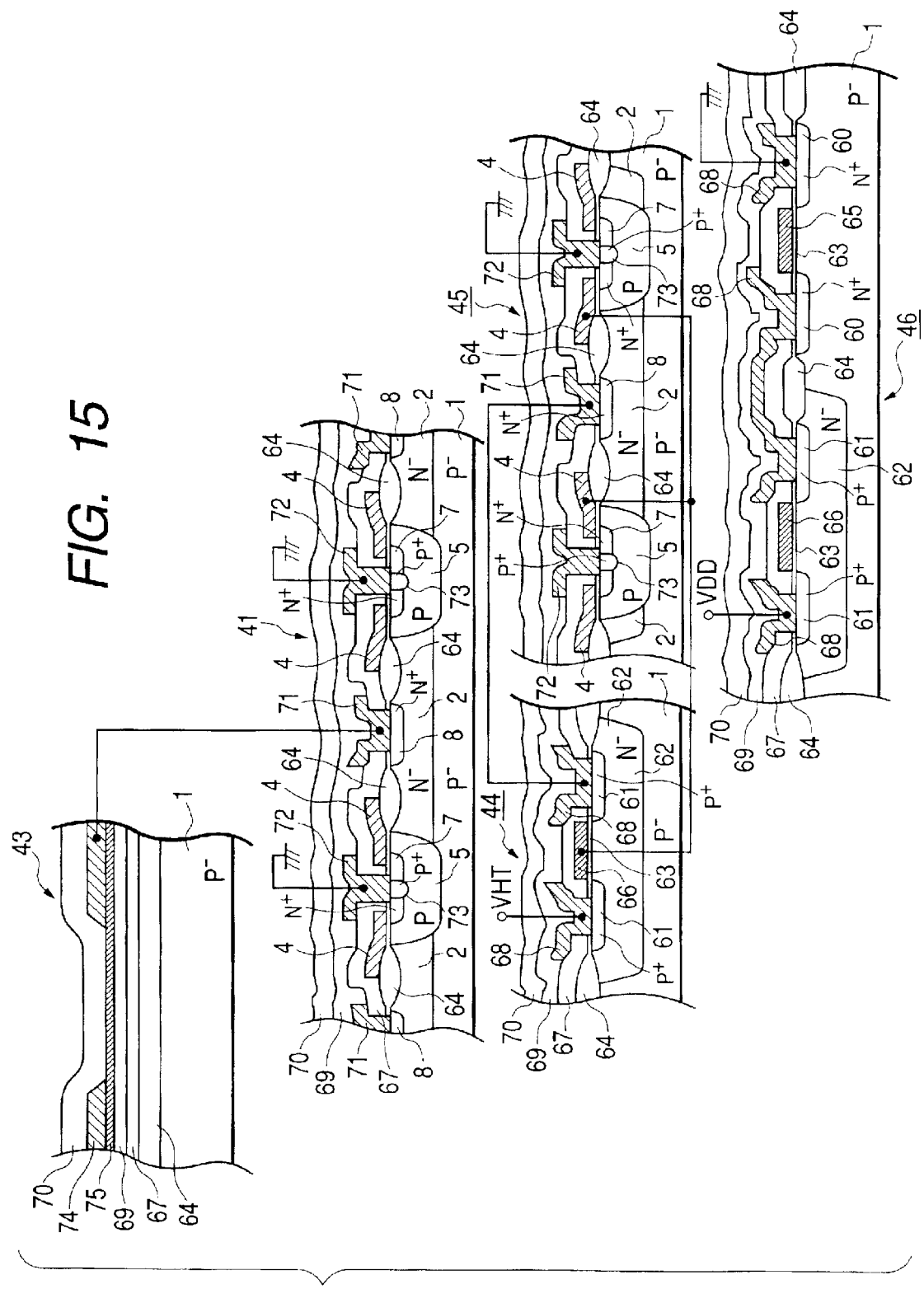
FIG. 15 is a circuit diagram showing a semiconductor device in accordance with a seventh embodiment of the present invention.

The cross-sectional structure of a semiconductor device according to this embodiment is shown in FIG. 15.

In this embodiment, DMOS transistors are used for the switching element 41 and the nMOS transistor 45 in the higher-voltage CMOS circuit.

The pMOS transistor 44 in the higher-voltage CMOS circuit and the nMOS transistor and the pMOS transistor in the lower-voltage CMOS logic circuit 46 are formed of MOS transistors having a characteristic different from that of the above-mentioned DMOS transistor.

A process of manufacturing a semiconductor device shown in FIG. 15 will be described below.

A semiconductor substrate 1 made of low-concentration p-type mono-crystal silicon or the like is prepared.

N-type impurities such as phosphorus or arsenic are then introduced into a predetermined portion of the semiconductor substrate 1, and semiconductor regions that form the lightly doped drain 2 of the DMOS transistor and the n-type well 62 of the pMOS transistor are formed at the same time.

A field insulating film 64 made of relatively thick silicon oxide is formed on the surface of the semiconductor substrate 1. The field insulating film 64 functions as the gate insulating film on the drain side of the DMOS transistor and also functions as the element isolation region for the CMOS transistor and the like.

After a gate insulating film 63 made of relatively thin silicon oxide has been formed, an electrode material made of polycrystal silicon is deposited and then patterned to form gate electrodes 4, 65 and 66.

P-type impurities such as boron are ion-implanted into a portion in which the source of the DMOS transistor is to be formed by using the gate electrode 4 as an ion implantation mask, and a heat treatment is then conducted to form the p-type base region 5 in such a manner that the p-type base region 5 penetrates through the n-type semiconductor region 2. Subsequently, a region on which the pMOS transistor is to be formed is covered with a photoresist mask, and n-type impurities such as phosphorus or arsenic are ion-implanted into a portion that becomes a source and a drain of the nMOS transistor by using the gate electrode 4 and the field insulating film 64 as ion implantation masks, and a heat treatment is then conducted to thereby form highly doped n-type semiconductor regions 7, 8 and 60.

A predetermined portion is covered with a photoresist mask. The gate electrode 66 is used as an ion implantation mask. And, p-type impurities such as boron are ion-implanted into a portion that becomes the source and drain 61 of the pMOS transistor and a part 73 of the source region 7 of the DMOS transistor. Thus, a heat treatment is conducted to thereby form highly doped p-type semiconductor regions 61 and 73. At this time, in the DMOS transistor portion, the p-type semiconductor region 73 is so formed as to break through the pn junction of the source region 7. With such arrangement, the source and the base can be readily short-circuited in a subsequent process. An insulating film 67 made of silicon oxide and doped with phosphorus or boron is deposited, and portions of the insulating film 67 above the source, the drain and the gate are etched to form contact holes at predetermined positions.

In order to form the source electrode 72 and the drain electrode 71 of the DMOS transistor, the drain electrode 71 and the source and drain electrodes 68 of the MOS transistor, a conductor such as aluminum containing copper therein is deposited and then patterned in a predetermined wiring shape.

A first interlayer insulating film 69 made of silicon oxide or the like is deposited, and through-holes are defined at predetermined positions.

In order to form a heating resistant layer 75 of the electro-thermal converter 43 that functions as a load, hafnium boride, silicon tantalum nitride, tantalic aluminum or the like is deposited on the surface, and a conductor such as aluminum containing copper therein is then deposited thereon. After the conductor 74 and the heating resistant layer 75 are patterned in a predetermined wiring shape by dry etching, a portion of the conductor 74 which becomes the heating portion is selectively removed by wet-etching.

A protective layer 70 made of silicon nitride or the like is deposited.

In this way, as semiconductor device having a cross-sectional structure shown in FIG. 15 is obtained.

In this embodiment, the gate electrode at the drain side is formed so as to be apart from the semiconductor substrate in the longitudinal direction, and an end portion of the highly doped drain region which is formed in a self-alignment manner is formed so as to be apart from the base region 5 in the lateral direction, by using the field insulating film. In this way, the breakdown voltage of the DMOS transistor at the drain side is remarkably improved.

Also, the semiconductor region 62 that becomes the n-well of the pMOS transistor is formed in the same process as that for forming the semiconductor region 2 which becomes the low-concentration drain of the DMOS transistor, to thereby reduce the manufacture costs of the CMOS circuit.

Although not shown in FIG. 15, in the case of using the level shift circuit shown in FIG. 14, it is preferable to use the offset MOS transistor shown in FIG. 1B or 10B, as occasion demands.

It is needless to say that a structure shown in FIG. 8 can be adopted without using the field insulating film as the DMOS transistor, or a structure shown in FIG. 1A or 10A can also be adopted.

An ink jet head according to this embodiment of the present invention can be manufactured by forming a heating resistant member having a wiring made of aluminum and a heating resistant layer made of tantalum nitride on an insulating layer (not shown) of the semiconductors according to each of the above-mentioned embodiments, and then combining therewith a discharge opening formation member such as a ceiling made of mold resin or film in order to form a discharge opening and an ink passage that communicates with the discharge opening. Then, an ink tank is connected thereto and mounted on a printer main body, and a supply voltage is applied from a power circuit of the main body and image data is supplied to the head from an image processing circuit, to thereby operate it as an ink jet printer.

Figure 16:
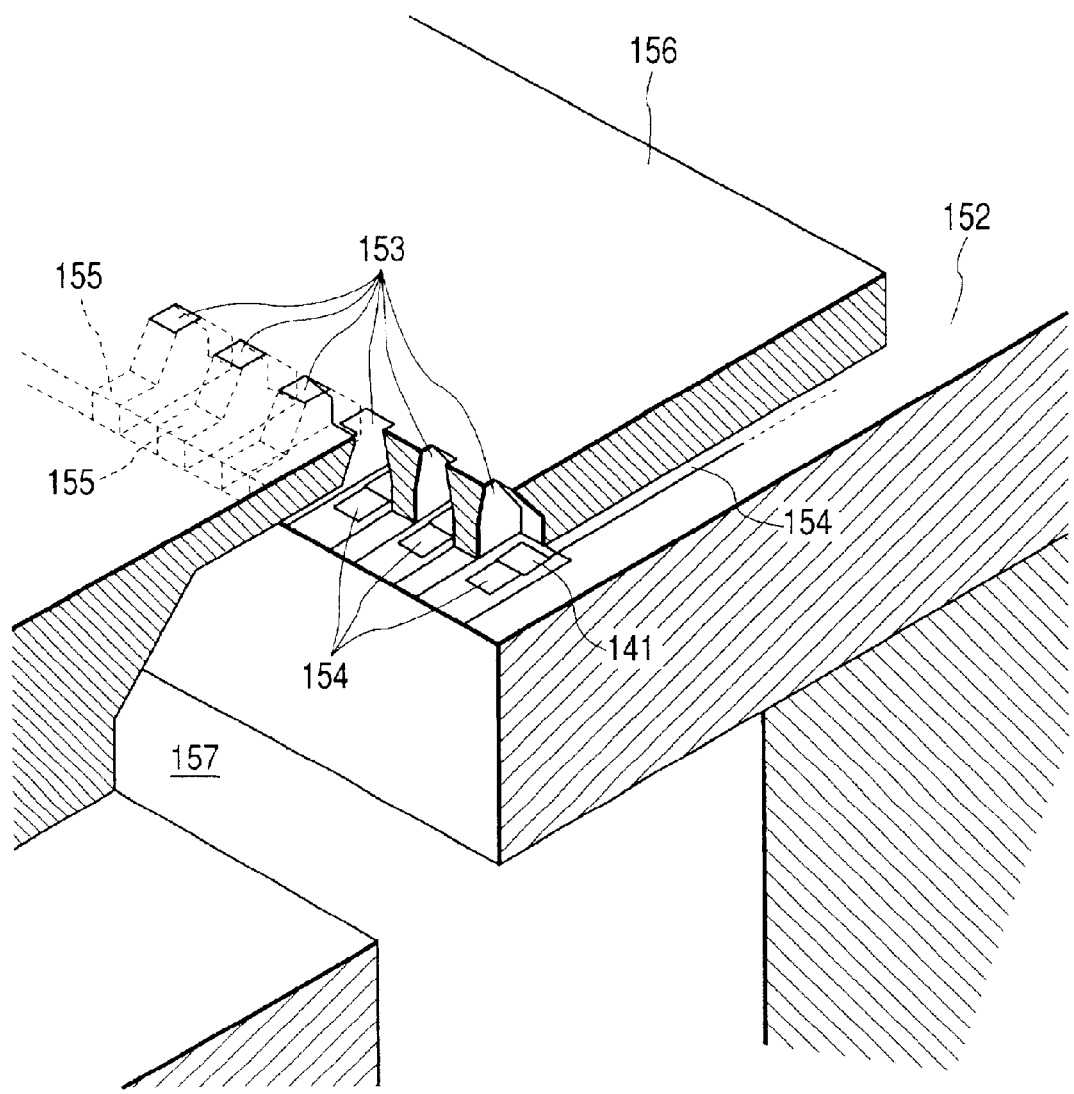
FIG. 16 is a diagram showing a part of a liquid jet head in accordance with one embodiment of the present invention.

FIG. 16 is a view for explaining a liquid jet head in accordance with an embodiment of the present invention, and shows a part of the ink jet head.

A plurality of electro-thermal converters (heaters) 141 for generating heat upon receiving an electric signal that allows a current to flow, and for jetting ink from discharge openings 153 by means of bubbles generated due to the heat are arranged in a line on an element substrate 152 on which a circuit shown in FIG. 2 or 14 is fabricated. Each of the electro-thermal converters is provided with a wiring electrode 154 that supplies an electric signal for driving the respective electro-thermal converters, and one end side of the wiring electrode is electrically connected to the switching element 41 which will be described later.

Each of passages 155 for supplying the ink to the discharge openings 153 disposed at positions opposing the electro-thermal converters 141 are disposed in correspondence with each of the discharge openings 153. A wall that defines the discharge openings 153 and the passages 155 is provided on grooved members 156, and the grooved members 156 are connected to the above-mentioned element substrate 152 to thereby define the passages 155 and a common liquid chamber 157 for supplying the ink to a plurality of the passages 155.

Figure 17:
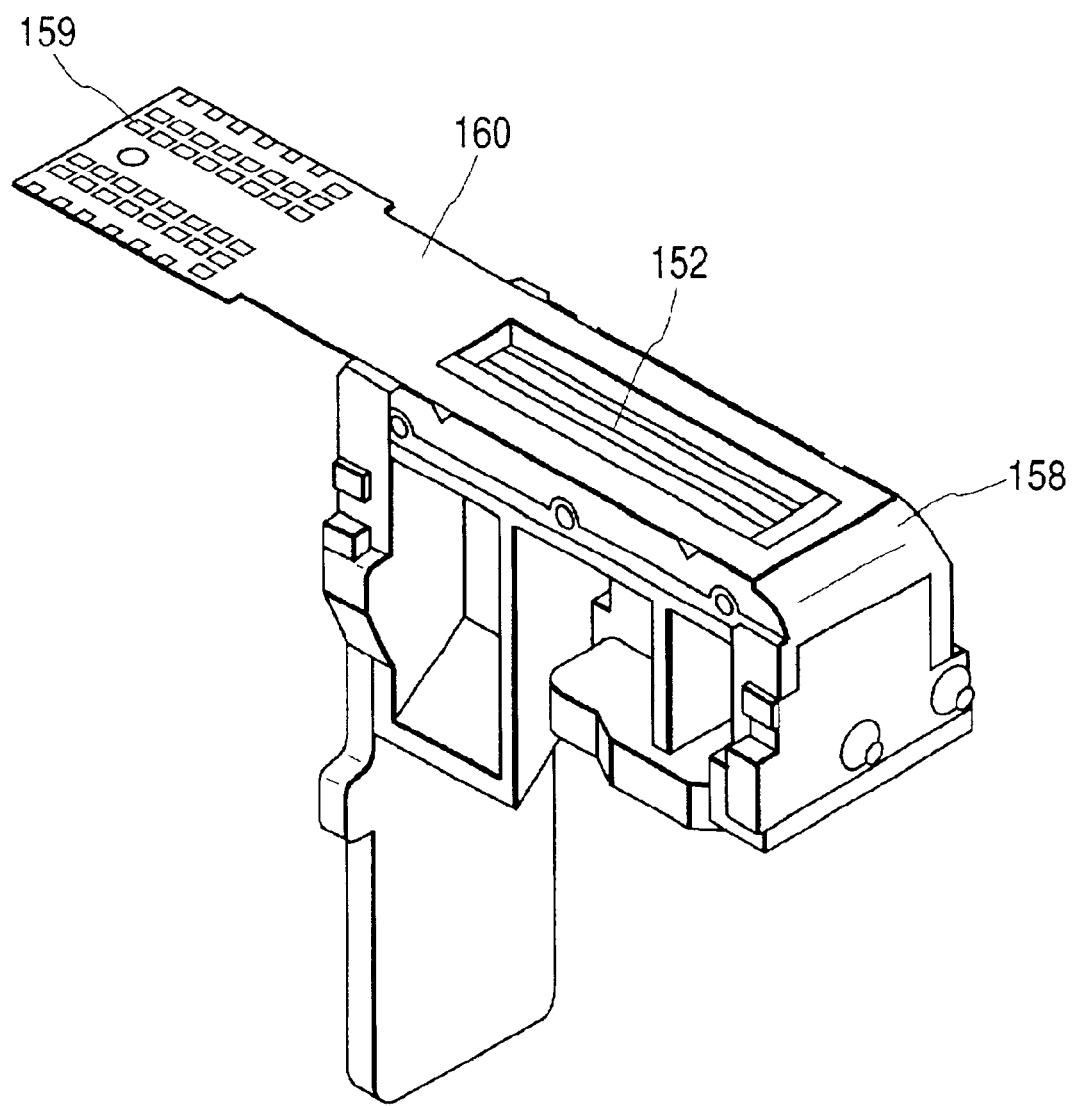
FIG. 17 is a view showing the appearance of a liquid jet head in accordance with one embodiment of the present invention.

FIG. 17 shows the structure of an ink jet recording head into which the element substrate 152 of the present invention is integrated, in which the element substrate 152 is integrated into a frame member 158. The above-mentioned member 156 that constitutes the discharge openings 153 and the passages 155 is attached onto the element substrate. Then, a contact pad 159 for receiving an electric signal from the device side is provided, and electric signals that become various drive signals are supplied from a controller of the device main body to the element substrate 152 through a flexible printed board 160.

Figure 18:
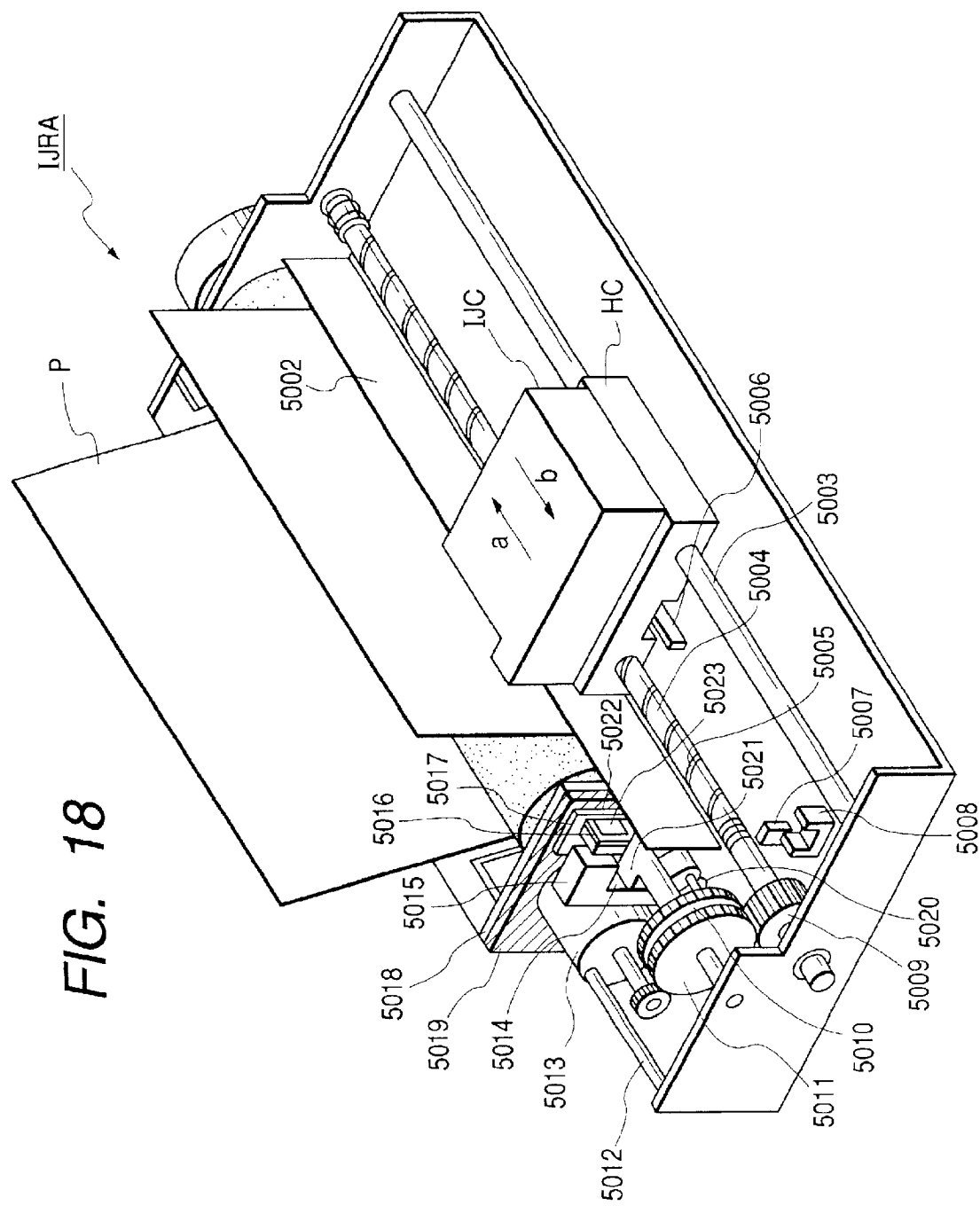
FIG. 18 is a view showing a liquid jet apparatus in accordance with one embodiment of the present invention.
Figure 19:
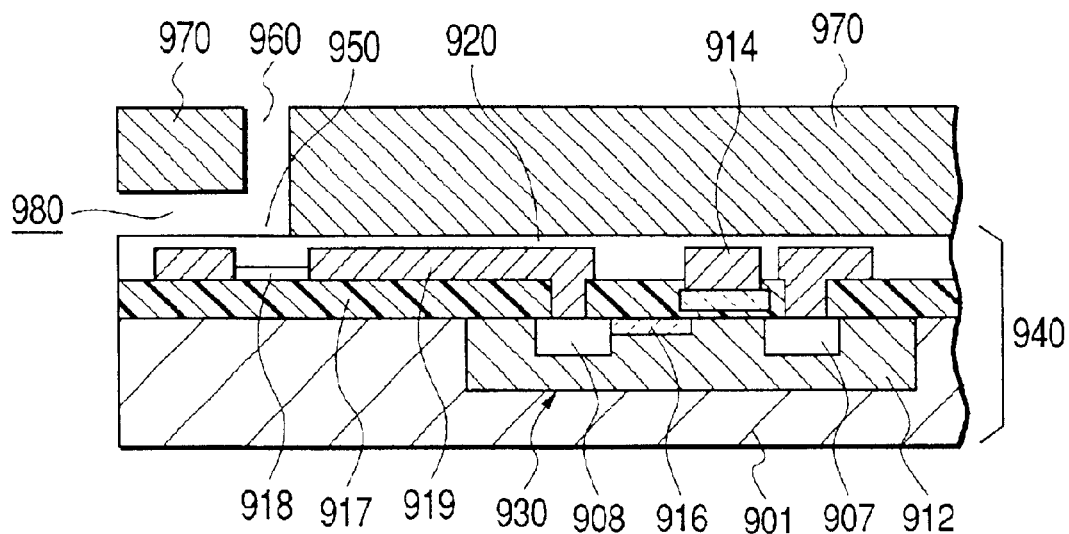
FIG. 19 is a schematic cross-sectional view showing a conventional recording head.

FIG. 18 is a view for explaining an embodiment of a liquid jet apparatus to which the liquid jet head of the present invention is applied, and shows the outline of an ink jet recording device IJRA.

A carriage HC that is engaged with a spiral groove 5004 of a lead screw 5005 that rotates through drive force transmission gears 5011 and 5009 in interlocking with the forward/reverse rotation of a drive motor 5013 has a pin (not shown) and performs reciprocating motion in directions indicated by arrows a and b.

Reference numeral 5002 denotes a paper pressing plate which presses a paper against a platen 5000 that functions as a recording medium transporting means over a range of carriage movement. Reference numeral 5007 and 5008 denote home position detecting means for performing switching of the rotational direction of the motor 5013 or the like upon confirming that a lever 5006 of the carriage exists in this area, by means of a photo-coupler. Reference numeral 5016 denotes a member that supports a cap member 5022 that caps a front surface of the recording head, and reference numeral 5015 is a sucking means that sucks the interior of the cap member 5022 and conducts the suction recovery of the recording head through a cap inner opening 5023. Reference numeral 5017 denotes a cleaning blade, and reference numeral 5019 is a member that enables the blade 5017 to move forward and backward. The cleaning blade 5017 and the member 5019 are supported to a main body support plate 5018. It is needless to say that the blade 5017 is not limited to this shape, but a well-known cleaning blade can be applied to this example. Also, reference numeral 5012 denotes a lever for starting the suction for the suction recovery and moves in association with the movement of a cam 5020 that is engaged with the carriage, and a drive force from the drive motor is movably controlled by a well-known transmission means such as a clutch switch.

The capping, cleaning and suction recovery are structured such that desired processing is conducted at their corresponding positions due to the action of the lead screw 5005 when the carriage comes to a home position side area. However, if a desired action can be conducted at a known timing, any other structure can be adopted in this example. The above-mentioned structures are excellent inventions both in themselves and as a composite structure thereof, and show preferable structural examples of the present invention.

Note that, this apparatus has a controller drive signal supplying means (not shown) formed of an electric circuit for supplying a supply voltage, an image signal, a drive control signal or the like to the element substrate 152.

As was described above, according to the present invention, the concentration of a drain of a MIS field effect transistor used in a switching element can be set to be lower than the concentration of a channel, and the drain can be formed sufficiently deeply. Therefore, a large current can be allowed to flow due to a high breakdown voltage, and high-speed operation is enabled by a low on resistance, thereby attaining higher integration and energy saving. Also, in a semiconductor that requires plural transistors arranged in an array, isolation among the elements can be readily conducted without increasing the costs.

In addition, because an element having an intermediate breakdown voltage and having an analog characteristic, which can set an arbitrary threshold voltage and withstand a back gate voltage, can be formed in a circuit for driving the switching element without increasing the costs, a semiconductor that can be freely designed and high in performance can be realized.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device in which a switching element for allowing a current to flow to a load and a circuit for driving said switching element are formed on a common substrate,
   wherein said switching element is a first insulated gate transistor which comprises:
      a first semiconductor region of a second conductive type disposed at one main surface of a semiconductor substrate of a first conductive type;
      a second semiconductor region of the first conductive type disposed within said first semiconductor region;
      a first gate electrode disposed on a surface in which a pn junction between said second semiconductor region and said first semiconductor region terminates, through an insulating film;
      a first source region of the second conductive type which is disposed on one end portion side of said first gate electrode within said second semiconductor region; and
      a first drain region of the second conductive type which is disposed within said first semiconductor region; and
   wherein said circuit for driving said switching element comprises a second insulated gate transistor having a characteristic different from that of said first insulated gate transistor.

2. The semiconductor device as claimed in claim 1, wherein said second insulated gate transistor constitutes a level shift circuit that generates a drive voltage applied to said first gate electrode.

3. The semiconductor device as claimed in claim 1, wherein a drain region of said second insulated gate transistor includes a low impurity concentration region.

4. The semiconductor device as claimed in claim 1, wherein said second insulated gate transistor constitutes a level shift circuit that generates a drive voltage applied to said first gate electrode, and a low impurity concentration region is disposed within a drain region of said second insulated gate transistor.

5. The semiconductor device as claimed in claim 1, wherein said second insulated gate transistor is a source follower transistor that constitutes a level shift circuit that generates a drive voltage applied to said first gate electrode through a CMOS circuit.

6. The semiconductor device as claimed in claim 1, wherein a well potential of said second insulated gate transistor is different from both a source potential and a drain potential.

7. The semiconductor device as claimed in claim 1, wherein a drain region of said second insulated gate transistor has a low impurity concentration region that is formed to be shallower than said first semiconductor region.

8. The semiconductor device as claimed in claim 1, wherein a drain region of said second insulated gate transistor has a low impurity concentration region having the same depth as that of said first semiconductor region.

9. The semiconductor device as claimed in claim 1, wherein said second insulated gate transistor is an MOS transistor of the first conductive type which constitutes a low-voltage CMOS circuit.

10. The semiconductor device as claimed in claim 1, wherein said second insulated gate transistor includes source and drain regions of the first conductive type which are formed within a well of the second conductive type.

11. The semiconductor device as claimed in claim 1, wherein an electro-thermal converter that functions as said load is connected to a drain of said switching element and is integrated with said switching element.

12. The semiconductor device as claimed in claim 1, wherein said characteristic is at least one selected from a threshold value, a breakdown voltage and a substrate current.

13. The semiconductor device as claimed in claim 1, wherein said second insulated gate transistor has an on resistance that is equal or greater, and an operation breakdown voltage that is $2/3$ or lower, as compared with those of said first insulated gate transistor.

14. The semiconductor device as claimed in claim 1, wherein said second insulated gate transistor has an on resistance that is equal or grater, and the maximum substrate current in an operation range which is 10 times or higher, as compared with those of said first insulated gate transistor.

15. A liquid jet apparatus that jets a liquid by using a heat generated from an electro-thermal converter, said apparatus comprising:
a semiconductor device as claimed in claim 1; and
a discharge opening disposed in correspondence with said electra-thermal converter that becomes said load.

16. The semiconductor device as claimed in claim 1, wherein said second semiconductor region is formed deeper than said first semiconductor region.

17. The semiconductor device as claimed in claim 16, wherein a plurality of first insulated gate transistors are arranged in an array without dedicated element isolation regions being interposed therebetween.

18. The semiconductor device as claimed in claim 1, wherein said circuit for driving said switching element comprises a low-voltage CMOS circuit having said second insulated gate transistor, and a high-voltage CMOS circuit that is controlled by said low-voltage CMOS circuit; and
wherein an MOS transistor of the first conductive type which constitutes said high-voltage CMOS circuit is a DMOS transistor produced in the same process as that for forming said first insulated gate transistor.

19. The semiconductor device as claimed in claim 18, further comprising a level shift circuit that generates a drive voltage applied to said first gate electrode through said high-voltage CMOS circuit.

20. A semiconductor device in which a switching element for allowing a current to flow to a load and a circuit for driving said switching element are formed on a common substrate, wherein:
said switching element is formed of a DMOS transistor;
said circuit for driving said switching element includes an MOS transistor having a characteristic different from that of said DMOS transistor; and
said MOS transistor is a source follower transistor that constitutes a level shift circuit that generates a drive voltage applied to a gate electrode of said DMOS transistor through a CMOS circuit.

21. A semiconductor device in which a switching element for allowing a current to flow to a load and a circuit for driving said switching element are formed on a common substrate, wherein:
said switching element is formed of a DMOS transistor;
said circuit for driving said switching element includes an MOS transistor having a characteristic different from that of said DMOS transistor; and
a drain region of said MOS transistor has a low impurity concentration region formed to be shallower than a base region that becomes a channel of said DMOS transistor.

22. A semiconductor device in which a switching element for allowing a current to flow to a load and a circuit for driving said switching element are formed on a common substrate, wherein:
said switching element is formed of a DMOS transistor;
said circuit for driving said switching element includes an MOS transistor having a characteristic different from that of said DMOS transistor; and
said MOS transistor is an MOS transistor of the first conductive type which constitutes a low-voltage CMOS circuit.

23. A semiconductor device in which a switching element for allowing a current to flow to a load and a circuit for driving said switching element are formed on a common substrate, wherein:
said switching element is formed of a DMOS transistor;
said circuit for driving said switching element includes an MOS transistor having a characteristic different from that of said DMOS transistor; and
an electro-thermal converter that functions as said load is connected to a drain of said DMOS transistor and is integrated with said switching element.

24. A semiconductor device in which a switching element for allowing a current to flow to a load and a circuit for driving said switching element are formed on a common substrate, wherein:
said switching element is formed of a DMOS transistor;
said circuit for driving said switching element includes an MOS transistor having a characteristic different from that of said DMOS transistor; and
said DMOS transistor comprises:
a first semiconductor region of a second conductive type disposed at one main surface of a semiconductor substrate of a first conductive type;
a second semiconductor region of the first conductive type disposed within said first semiconductor region;
a first gate electrode disposed on a surface in which a pn junction between said second semiconductor region and said first semiconductor region terminates, through an insulating film;
a first source region of the second conductive type which is disposed on one end portion side of said first gate electrode within said second semiconductor region; and
a first drain region of the second conductive type disposed within said first semiconductor region.

25. A semiconductor device in which a switching element for allowing a current to flow to a load and a circuit for driving said switching element are formed on a common substrate, wherein said switching element is formed of a DMOS transistor;
said circuit for driving said switching element includes an MOS transistor having a characteristic different from that of said DMOS transistor; and
said MOS transistor has an on resistance that is equal or greater, and an operation breakdown voltage that is ⅔ or lower, as compared with those of said DMOS transistor.

26. A semiconductor device in which a switching element for allowing a current to flow to a load and a circuit for driving said switching element are formed on a common substrate, wherein
said switching element is formed of a DMOS transistor;
said circuit for driving said switching element includes an MOS transistor having a characteristic different from that of said DMOS transistor; and
said MOS transistor has an on resistance that is equal or greater, and the maximum substrate current in an operation range which is 10 times or higher, as compared with those of said DMOS transistor.

27. A liquid jet apparatus that jets a liquid by using a heat generated from an electro-thermal converter, said apparatus comprising:
a semiconductor device in which a switching element for allowing a current to flow to a load and a circuit for driving said switching element are formed on a common substrate,
wherein said switching element is a first insulated gate transistor which comprises:
a first semiconductor region of a second conductive type disposed at one main surface of a semiconductor substrate of a first conductive type;
a second semiconductor region of the first conductive type disposed within said first semiconductor region;
a first gate electrode disposed on a surface in which a pn junction between said second semiconductor region and said first semiconductor region terminates, through an insulating film;
a first source region of the second conductive type which is disposed on one end portion side of said first gate electrode within said second semiconductor region; and
a first drain region of the second conductive type which is disposed within said first semiconductor region; and
wherein said circuit for driving said switching element comprises a second insulated gate transistor having a characteristic different from that of said first insulated gate transistor;
a discharge opening disposed in correspondence with said electro-thermal converter that becomes said load;
a container that contains said liquid that is supplied onto said electro-thermal converter; and
a power circuit for supplying a power voltage to said semiconductor device.

28. A liquid jet apparatus that jets a liquid by using a heat generated from an electro-thermal converter, said apparatus comprising:
a semiconductor device in which a switching element for allowing a current to flow to a load and a circuit for driving said switching element are formed on a common substrate, wherein:
said switching element is formed of a DMOS transistor; and
said circuit for driving said switching element includes an MOS transistor having a characteristic different from that of said DMOS transistor;
a discharge opening disposed in correspondence with said electro-thermal converter that becomes said load;
a container that contains said liquid that is supplied onto said electro-thermal converter; and
a power circuit for supplying a power voltage to said semiconductor device.

29. A method of manufacturing a semiconductor device in which a switching element for allowing a current to flow to a load, and a circuit for driving said switching element are formed on a common substrate, said method comprising the steps of:
forming a first semiconductor region of a second conductive type at one main surface of a first conductive type semiconductor substrate;
forming a gate insulating film on said first semiconductor region;
forming a first gate electrode on a surface of said first semiconductor region through said gate insulating film, and a second gate electrode on a surface of said semiconductor substrate through said gate insulating film;
forming a second semiconductor region of a first conductive type which has a higher concentration than that of said first semiconductor region, within said first semiconductor region by ion implantation of first conductive type impurities using said first gate electrode as a mask;
forming a lightly doped drain region of the second conductive type in said semiconductor substrate by ion implantation of impurities of the second conductive type, using said second gate electrode as a mask; and
forming a first source region of the second conductive type within said second semiconductor region at a surface side of said second semiconductor region by ion implantation using said first gate electrode as a mask, forming a first drain region of the second conductive type within said first semiconductor region at a surface side of said first semiconductor region, forming a second source region of the second conductive type at a surface side of said semiconductor substrate by ion implantation, and forming a second drain region of the second conductive type so as to be apart from an end portion of said lightly doped drain region on the second gate electrode side;
wherein said first gate electrode is disposed on a surface in which a pn junction between said second semiconductor region and said first semiconductor region terminates, through an insulating film;
wherein said first source region is disposed on one end portion side of said first gate electrode;
wherein said switching element is a first insulated gate transistor which comprises said first semiconductor region, said second semiconductor region, said first gate electrode, said first source region, and said first drain region; and
wherein said circuit for driving said switching element comprises a second insulated gate transistor having a characteristic different from that of said first insulated gate transistor.

30. The method of manufacturing a semiconductor device as claimed in claim 29, wherein said second semiconductor region is formed so as to be higher in concentration than said first semiconductor region and deeper than said first semiconductor region, in order to electrically insulate said first semiconductor region by ion implantation of the first conductive impurities using said first gate electrode as a mask and a heat treatment.

31. A method of manufacturing a semiconductor device in which a switching element for allowing a current to flow to a load, and a circuit for driving said switching element are formed on a common substrate, said method comprising the steps of:

forming a plurality of first semiconductor regions of a second conductive type at one main surface of a semiconductor substrate of a first conductive type;

forming a gate insulating film on said plurality of first semiconductor regions;

forming a first gate electrode on a surface of one of said plurality of first semiconductor regions through said gate insulating film, and a second gate electrode on a surface in which a pn junction between said semiconductor substrate and another one of said plurality of first semiconductor regions terminates, through said gate insulating film;

forming a second semiconductor region of the first conductive type within said one of said plurality of first semiconductor regions by ion implanting impurities of the first conductive type, using said first gate electrode as a mask;

forming a first source region of the second conductive type within said second semiconductor region at a surface side of said second semiconductor region by ion implanting impurities of the second conductive type using said first gate electrode as a mask, forming a first drain region of the second conductive type within said one of said plurality of semiconductor regions at a surface side of said one of said plurality of first semiconductor regions, forming a second source region of the second conductive type at a surface side of said semiconductor substrate, and forming a second drain region of the second conductive type at a surface side of said another one of said plurality of first semiconductor regions so as to be apart from a pn junction between said semiconductor substrate and said another one of said plurality of first semiconductor regions;

wherein said first gate electrode is disposed on a surface in which a pn junction between said second semiconductor region and said one of said plurality of first semiconductor regions terminates, through said gate insulating film;

wherein said first source region is disposed on one end portion side of said first gate electrode;

wherein said switching element is a first gate insulated transistor which comprises said one of said plurality of first semiconductor regions, said second semiconductor region, said first gate electrode, said first source region, and said first drain region; and wherein said circuit for driving said switching element comprises a second insulated gate transistor having a characteristic different from that of said first insulated gate transistor.

32. The method of manufacturing a semiconductor device as claimed in claim 31, wherein said second semiconductor region is formed so as to be higher in concentration than and deeper than said one of said plurality of first semiconductor regions, in order to isolate one of said plurality of first semiconductor regions.

* * * * *

UNITED STATES PATENT AND TRADEMARK OFFICE
CERTIFICATE OF CORRECTION

PATENT NO. : 6,800,902 B2
DATED : October 5, 2004
INVENTOR(S) : Mineo Shimotsusa It is certified that error appears in the above-identified patent and that said Letters Patent is hereby corrected as shown below:

Column 1,
Lines 10 and 38, "a MIS" should read -- an MIS --.

Column 5,
Line 19, "aid" should read -- said --.

Column 6,
Line 17, "circuit-sectional" should read -- cross-sectional --.

Column 7,
Line 7, "head; and" should read -- head; --.
Line 63, "self alignment" should read -- self-alignment --.

Column 9,
Line 46, "thus" should read -- the --.

Column 10,
Line 35, "constitutes" should read -- constitute --.

Column 13,
Line 10, "boron, is" should read -- boron, are --.
Line 24, "phosphorous, is" should read -- phosphorous, are --.
Line 54, "MOC" should read -- MOS --.

Column 14,
Line 36, "MDOS" should read -- DMOS --.
Line 47, "boron, is" should read -- boron, are --.
Line 63, "phosphorous, is" should read -- phosphorous, are --.

Column 15,
Line 21, "integrate" should read -- integrated --.

Column 17,
Line 16, "boron, is" should read -- boron, are --.
Line 48, "have" should read -- has --.

Column 18,
Line 46, "boron, is" should read -- boron, are --.

UNITED STATES PATENT AND TRADEMARK OFFICE
CERTIFICATE OF CORRECTION

PATENT NO. : 6,800,902 B2
DATED : October 5, 2004
INVENTOR(S) : Mineo Shimotsusa It is certified that error appears in the above-identified patent and that said Letters Patent is hereby corrected as shown below:

Column 19,
Line 8, "integrate" should read -- integrated --.

Column 20,
Line 24, "constitutes" should read -- constitute --.
Line 40, "is made" should read -- are made --.

Column 21,
Line 66, "as" should read -- a --.

Column 22,
Line 10, "n-well" should read -- n-type well --.

Column 25,
Line 32, "grater," should read -- greater, --.
Line 40, "electra-thermal" should read -- electro-thermal --.

Signed and Sealed this

Seventeenth Day of May, 2005

JON W. DUDAS
*Director of the United States Patent and Trademark Office*